(12) United States Patent
Chen et al.

(10) Patent No.: US 9,613,857 B2
(45) Date of Patent: Apr. 4, 2017

(54) ELECTROSTATIC DISCHARGE PROTECTION STRUCTURE AND METHOD

(71) Applicant: Taiwan Semiconductor Manufacturing Company, Ltd., Hsin-Chu (TW)

(72) Inventors: Jie Chen, New Taipei (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/527,836

(22) Filed: Oct. 30, 2014

(65) Prior Publication Data

US 2016/0126220 A1 May 5, 2016

(51) Int. Cl.
*H01L 23/02* (2006.01)
*H01L 21/768* (2006.01)
(Continued)

(52) U.S. Cl.
CPC ...... *H01L 21/76877* (2013.01); *H01L 21/563* (2013.01); *H01L 21/6835* (2013.01); *H01L 21/6836* (2013.01); *H01L 23/3135* (2013.01); *H01L 23/528* (2013.01); *H01L 23/5226* (2013.01); *H01L 23/552* (2013.01); *H01L 24/19* (2013.01); *H01L 24/97* (2013.01); *H01L 25/105* (2013.01); *H01L 25/50* (2013.01); *H01L 24/32* (2013.01); *H01L 24/73* (2013.01); *H01L 24/83* (2013.01); *H01L 24/92* (2013.01); *H01L 2221/68359* (2013.01); *H01L 2221/68372* (2013.01); *H01L 2221/68381* (2013.01); *H01L 2224/04105* (2013.01); *H01L 2224/12105* (2013.01); *H01L 2224/32145* (2013.01); *H01L 2224/32225* (2013.01); *H01L 2224/73265* (2013.01); *H01L 2224/73267* (2013.01); *H01L 2224/83005* (2013.01); *H01L 2224/92244* (2013.01); *H01L 2224/97* (2013.01);
(Continued)

(58) Field of Classification Search
CPC ......... H01L 23/489; H01L 24/11; H01L 21/56
USPC .................................................. 257/686, 659
See application file for complete search history.

(56) References Cited

U.S. PATENT DOCUMENTS 8,503,186 B2 * 8/2013 Lin .................. H01L 21/76898
257/433
8,803,332 B2 * 8/2014 Lee ....................... H01L 21/561
257/686

(Continued)

FOREIGN PATENT DOCUMENTS

KR 20120060486 A 6/2012

*Primary Examiner* — Tuan Nguyen
(74) *Attorney, Agent, or Firm* — Slater Matsil, LLP

(57) ABSTRACT

A semiconductor package comprises a top package and a bottom package with a plurality of fan-out interconnect structures. A plurality of inter-package connectors are formed inside a gap between the top package and the bottom package. A conductive protection layer is formed over the semiconductor package, wherein the conductive protection layer seals the gap around its perimeter, wherein the conductive protection layer covers an upper surface and a side wall of the top package, and wherein the conductive protection layer covers portions of an upper surface of the bottom package that extend beyond a boundary of the top package and a top portion of a side wall of the bottom package.

20 Claims, 24 Drawing Sheets

(51) Int. Cl.
*H01L 21/56* (2006.01)
*H01L 25/00* (2006.01)
*H01L 23/31* (2006.01)
*H01L 23/522* (2006.01)
*H01L 23/528* (2006.01)
*H01L 23/552* (2006.01)
*H01L 23/00* (2006.01)
*H01L 25/10* (2006.01)
*H01L 21/683* (2006.01)

(52) U.S. Cl.
CPC ........... *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01); *H01L 2924/1815* (2013.01); *H01L 2924/3025* (2013.01)

(56) References Cited

U.S. PATENT DOCUMENTS

| | | | |
|---|---|---|---|
| 2003/0116349 A1* | 6/2003 | Hashimoto | H01L 23/49805 174/260 |
| 2004/0178484 A1* | 9/2004 | Burdick, Jr. | H01L 23/36 257/678 |
| 2011/0031598 A1* | 2/2011 | Lee | H01L 23/49827 257/686 |
| 2011/0278703 A1* | 11/2011 | Pagaila | H01L 23/5389 257/659 |
| 2011/0298101 A1 | 12/2011 | Pagaila et al. | |
| 2012/0139090 A1 | 6/2012 | Kim et al. | |
| 2014/0217604 A1* | 8/2014 | Chou | H01L 24/11 257/774 |

* cited by examiner

ELECTROSTATIC DISCHARGE PROTECTION STRUCTURE AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. This high level of integration from PoP technology enables production of semiconductor devices with enhanced functionalities and small footprints on the printed circuit board (PCB). A semiconductor package with a small footprint on PCB is advantageous for small form factor devices such as mobile phones, tablets and digital music players. Another advantage of a PoP package is that it minimizes the length of the conductive paths connecting the interoperating parts within the package. This improves the electrical performance of the semiconductor device, since shorter routing of interconnections between circuits yields faster signal propagation and reduced noise and cross-talk.

Many challenges exist for the manufacturing of PoP packages. For example, during manufacturing, testing, shipping and handling, static electricity can build up on the PoP package. Without proper electrostatic discharge (ESD) protection, the circuits inside the package can be easily damaged.

Efforts have been made to address different difficulties for the PoP technology. However, there is still a need in the art for PoP type semiconductor packages which have improved mechanical and/or electrical characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Corresponding numerals and symbols in the different figures generally refer to corresponding parts unless otherwise indicated.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1:
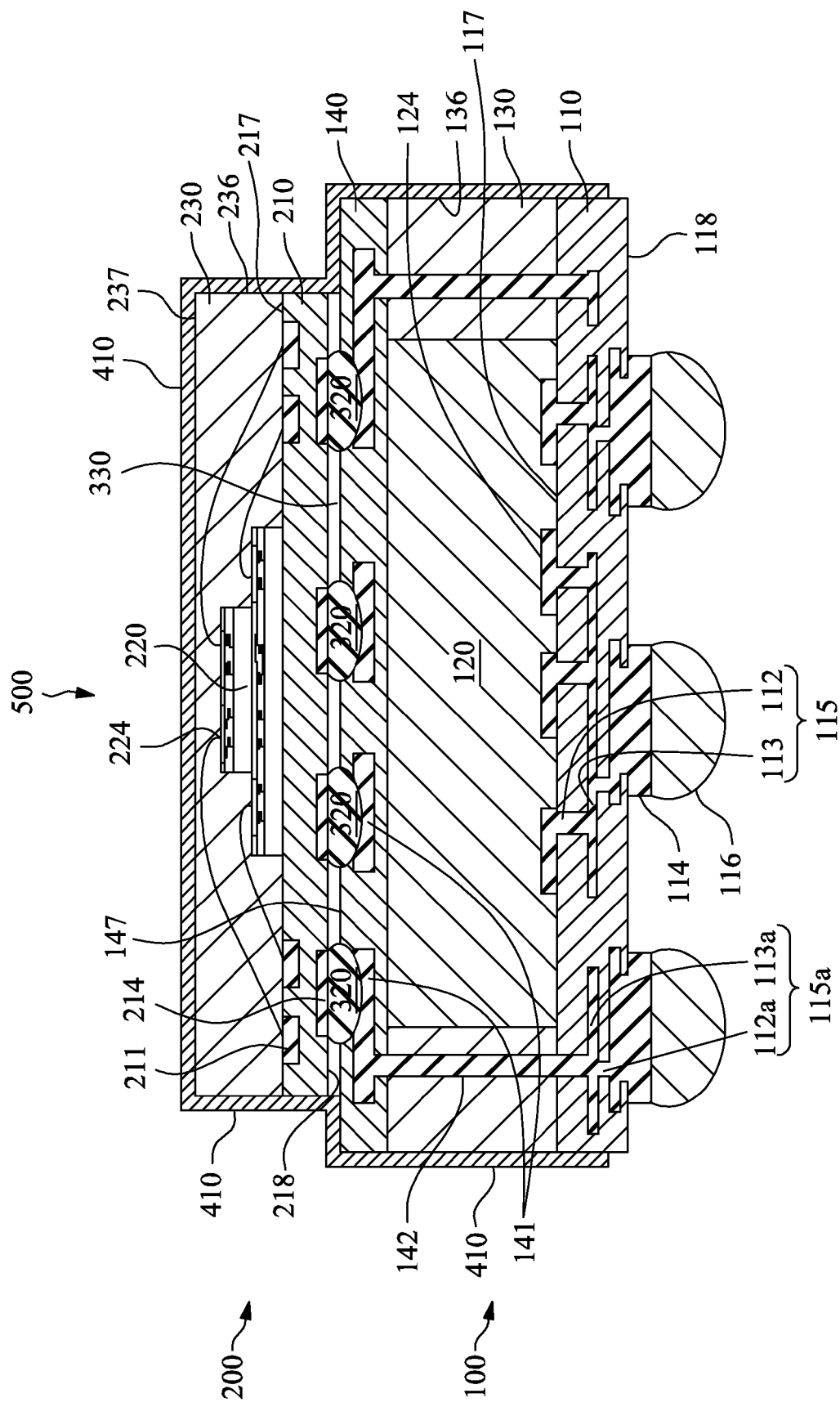
FIG. 1 illustrates a cross sectional view of a semiconductor PoP package in accordance with an embodiment of the present disclosure.

FIG. 1 illustrates a cross sectional view of a PoP package 500 in accordance with some embodiments of the present disclosure. The PoP package 500 contains a top semiconductor package 200 stacked on top of a bottom semiconductor package 100. The bottom package 100 has a semiconductor device 120 mounted one a front-side dielectric layer 110. Although FIG. 1 shows the front-side dielectric layer 110 as one layer, those skilled in the art will appreciate that font-side dielectric layer 110 may comprise a plurality of dielectric layers formed using suitable methods known in the art. The semiconductor device 120 may have one chip inside, in some embodiments. The semiconductor device 120 may include a plurality of chips stacked together by a suitable method known in the art, in accordance with some embodiments. The plurality of semiconductor chips in the top package may be of the same type, such as digital signal processors (DSP) or memory chips. Alternatively, these semiconductor chips may be of different types, with some being DSP chips, some being logic chips, and yet some others being memory chips. The contact pads 124 of semiconductor device 120 are connected to a plurality of interconnect structures 115 of a front-side dielectric layer 110. In some embodiments, interconnect structure 115 and front-side dielectric layer 110 are collectively referred to as a redistribution layer (RDL) or redistribution layers (RDLs). A plurality of redistribution contact pads 141 are located in a back-side dielectric layer 140 near an upper surface 147 of bottom package 100. Back-side dielectric layer 140 may include one or more dielectric layers, in some embodiments. The redistribution contact pads 141 may be part of one or more conductive layers that include metal lines and vias (not shown) in back-side dielectric layer 140, in some embodiments. In accordance with some embodiments, redistribution contact pads 141, the one or more conductive layers (not shown), and back-side dielectric layer 140 are collectively referred to as a backs-side redistribution layer (BSRDL) or back-side redistribution layers (BSRDLs).

The size of the top package 200 may be smaller than that of the bottom package (i.e., when viewed from the top, a perimeter of the top package 200 is within a perimeter of the bottom package 100), in some embodiments. The top package 200 has a semiconductor device 220 mounted on an upper surface 217 of a substrate 210. The semiconductor device 220 may include one chip, in some embodiments. The semiconductor device 220 may include a plurality of semiconductor chips stacked together using known methods in the art, in some other embodiments.

The top package substrate 210 may be made of a semiconductor wafer, or a portion of wafer. In some embodiments, substrate 210 includes silicon, gallium arsenide, silicon on insulator ("SOI") or other similar materials. In some embodiments, substrate 210 also includes passive devices such as resistors, capacitors, inductors and the like, or active devices such as transistors. In some embodiments, substrate 210 includes additional integrated circuits. Substrate 210 may further include through substrate vias (TSVs) and may be an interposer. In addition, substrate 210 may be made of other materials. For example, in some embodiments, substrate 210 is a multiple-layer circuit board. In some embodiments, substrate 210 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Substrate 210 includes interconnect structures (not shown), which include one or more layers of metal lines and vias, in accordance with some embodiments. Interconnect structures in substrate 210 connect to contact pads 211, which are bonded to semiconductor device 220, and contact pads 214 on opposite side of substrate 210, which are bonded to external connectors 216 (shown in FIG. 2*i*). In some embodiments, contact pads 211 and 214 comprise aluminum, copper, silver, gold, nickel, tungsten, alloys thereof, and/or multi-layers thereof. In some embodiments, contact pads 214 are made of copper or copper alloy. External connectors 216 are bonded to contact pads 214 on a lower surface 218 of substrate 210, in accordance with some embodiments. External connectors 216 are made of conductive materials such as solder, solder alloy, copper, copper alloy, gold, or gold alloy, etc. External connectors 216 may be bonded to the conductive pads 214 by a reflow process. In some embodiments, external connectors 216 are BGA balls.

The gap between top package 200 and bottom package 100 defines a space 330. Inter-package connectors 320 are formed between top package 200 and bottom package 100 inside the space 330. Inter-package connectors 320 mechanically and electrically couple contact pads 214 on a lower surface 218 of top package 200 to redistribution contact pads 141 near an upper surface 147 of lower package 100.

A conductive protection layer 410 is formed over certain areas of the PoP package 500, in some embodiments. Conductive protection layer 410 provides ESD protection for the semiconductor chips inside PoP package 500, in accordance with some embodiments.

FIG. 2*a*-2*e* illustrate the intermediate steps of fabricating the PoP structure 500 shown in FIG. 1, in accordance with various embodiments of the present disclosure.

Figure 2A:
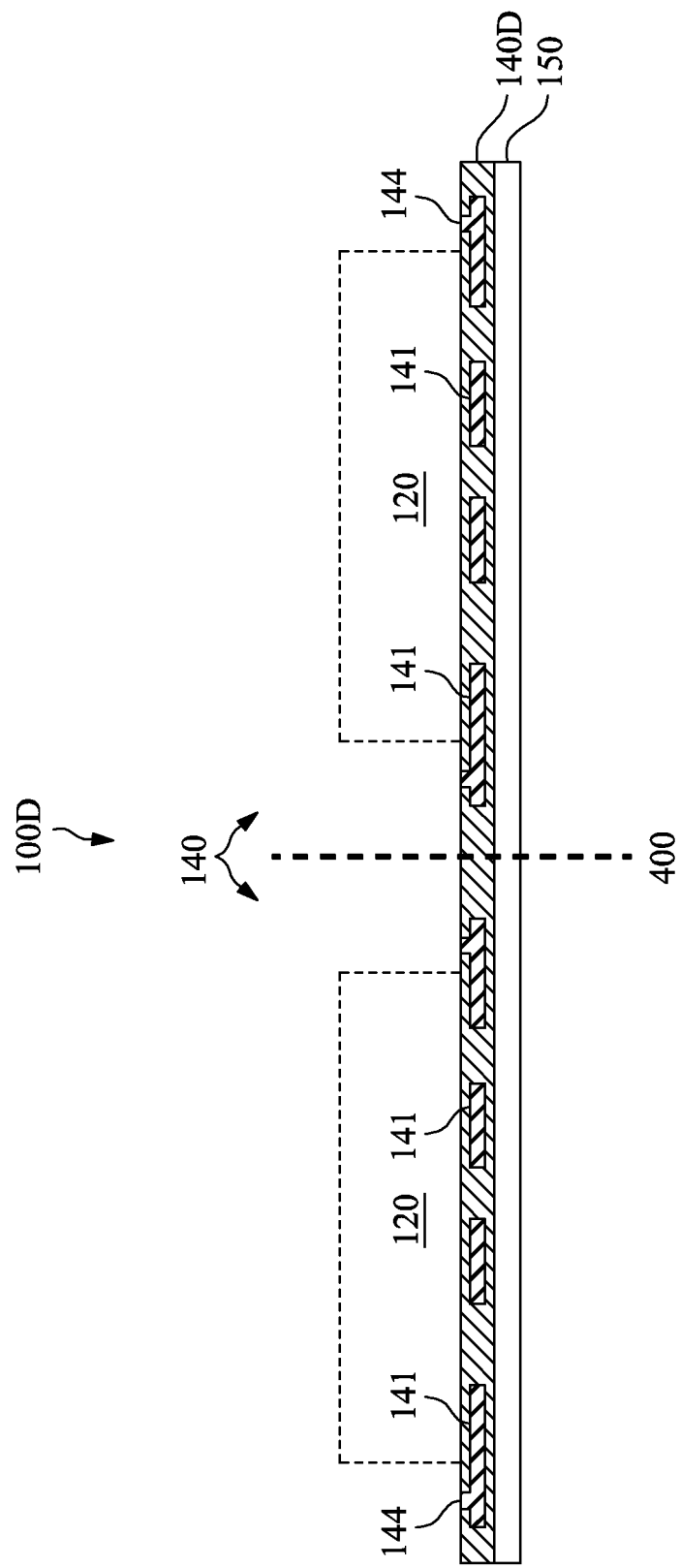
FIG. 2a-2o are cross sectional views of the PoP structure shown in FIG. 1 at various manufacturing stages, in accordance with some embodiments of the present disclosure.

FIG. 2*a* illustrates a cross sectional view of a back-side dielectric layer 140D formed on a carrier 150. Although back-side dielectric layer 140D is shown as one layer, those skilled in the art will appreciate that back-side dielectric layer 140D may include a plurality of dielectric layers. A plurality of semiconductor devices 120 that will be attached to the back-side dielectric layer 140D are shown in phantom. The back-side dielectric layer 140D contains a plurality of identical portions 140 divided by line 400. Each portion 140 corresponds to the back-side dielectric layer 140 in FIG. 1.

Back-side dielectric layer 140D, together with other components/devices/layers formed around it as described in the following processing steps shown in FIG. 2*a*-2*k*, will be referred to as structure 100D hereafter.

The carrier 150 may contain base material such as silicon, polymer, polymer composite, metal foil, ceramic, glass, glass epoxy, beryllium oxide, tape, or other suitable material for structural support. In some embodiments, carrier 150 is made of glass. An adhesive layer (not shown) may be deposited or laminated over carrier 150, in some embodiments. The adhesive layer may be photosensitive and is easily detached from carrier 150 by shining ultra-violet (UV) light on carrier 150 after bottom packages 100 are formed. For example, the adhesive layer may be a light-to-heat-conversion (LTHC) coating made by 3M Company of St. Paul, Minn.

Back-side dielectric layer 140D may comprise one or more dielectric layers formed on carrier 150 using suitable methods known in the art, such as physical vapor deposition (PVD), chemical vapor deposition (CVD), printing, spin coating, spray coating, sintering, or thermal oxidation. Back-side dielectric layer 140D may be made of polymers, such as polyimide, polybenzoxazole, or benzocyclobutene, in some embodiments, or silicon dioxide, silicon nitride, silicon oxynitride, tantalum pentoxide, or aluminum oxide, in some other embodiments.

A plurality of redistribution contact pads 141 are formed within the back-side dielectric layer 140D. The redistribution contact pads 141 may be part of one or more back-side redistribution layers that comprise one or more conductive layers of metal lines and vias (not shown). The conductive layers may be formed using patterning with PVD, CVD, sputtering, electrolytic plating, electroless plating, or other suitable metal deposition process, in accordance with some embodiments. The conductive layers may comprise aluminum, copper, nickel, tin, gold, silver, or other suitable conductive materials, in some embodiments. Some of the redistribution contact pads 141 may include contact pads 144 used for forming vias 142 in a subsequent processing step.

Figure 2B:
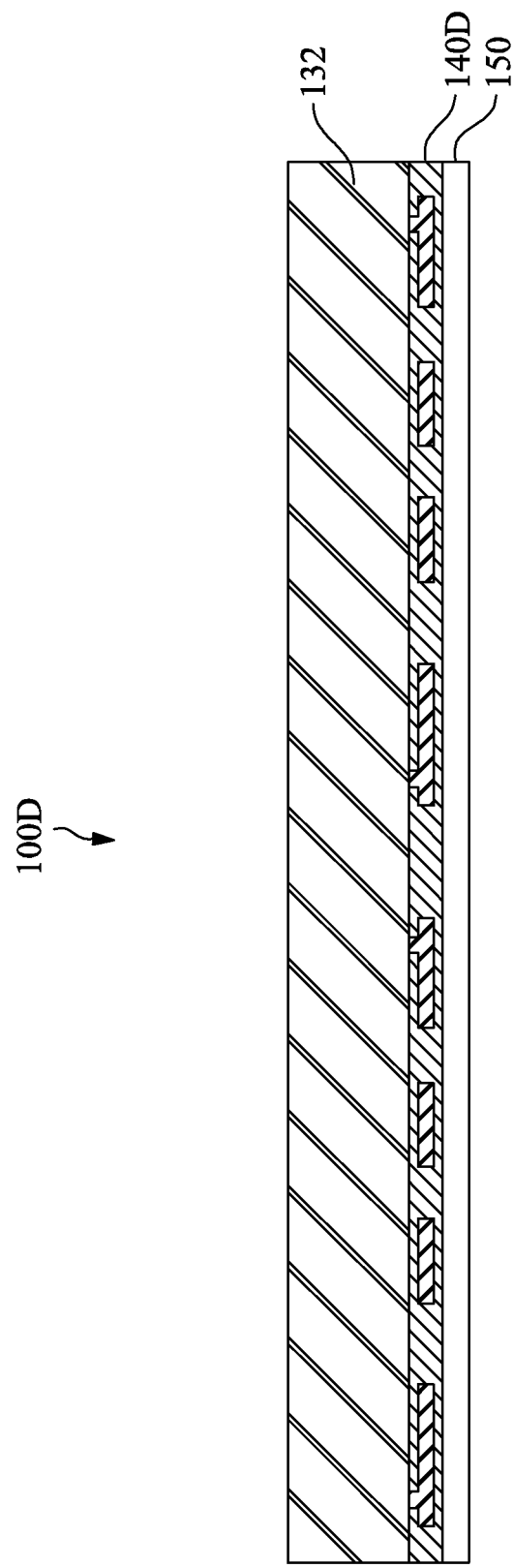
Figure 2C:
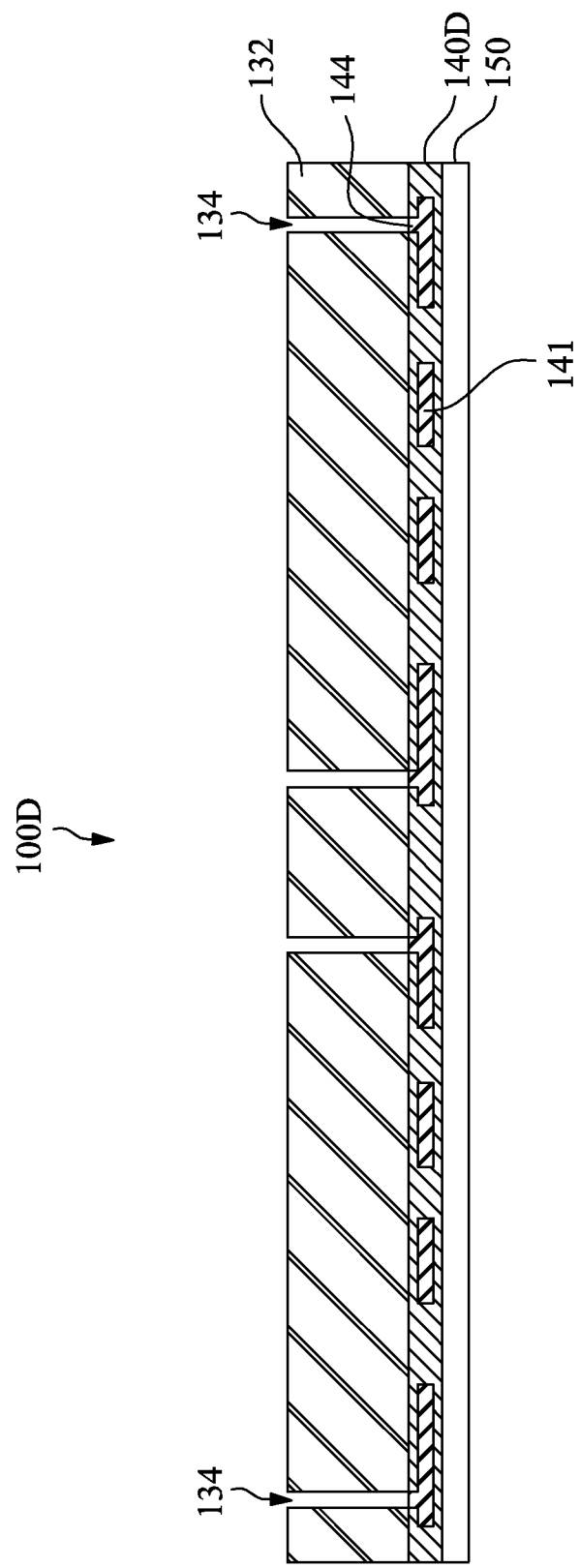

A sacrificial material 132 is formed over the back-side dielectric layer 140D, as shown in FIG. 2*b*. The sacrificial material 132 comprises a photoresist, an organic material, an insulating material, or other materials, in some embodiments, as examples. The sacrificial material 132 is patterned with a desired pattern for forming vias 142 (see FIG. 1) using a lithography process or a direct patterning process, as shown in FIG. 2*c*. In a lithography process, the sacrificial material 132 is exposed to light or energy reflected from or transmitted through a lithography mask (not shown) that has the desired pattern thereon. The sacrificial material 132 is then developed, and portions of the sacrificial material 132 are then ashed or etched away. A direct patterning process may comprise forming the pattern in the sacrificial material 132 using a laser, for example. Alternatively, the sacrificial material 132 may be patterned using other methods. In an embodiment of the present disclosure, sacrificial material 132 is patterned to have openings 134 through it, which openings expose top surfaces of contact pads 144 in the back-side dielectric layer 140D.

Figure 2D:
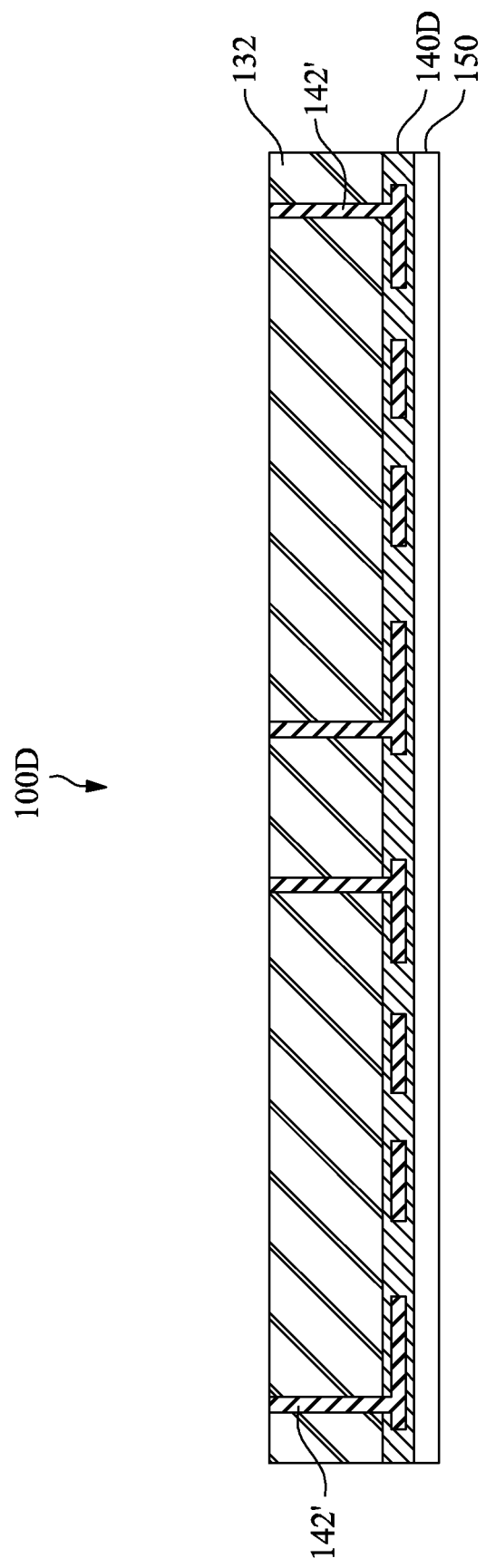

In accordance with an embodiment of the present disclosure, openings 134 in the sacrificial material 132 are filled with conductive material to form conductive features 142', as shown in FIG. 2*d*. The conductive material may comprise copper, although other suitable conductive materials may also be used. In some embodiments, a plating process is used to form a conductive material in the openings of the sacrificial material 132. The plating process may comprise an electro-chemical plating (ECP) or other types of plating processes, for example.

Figure 2E:
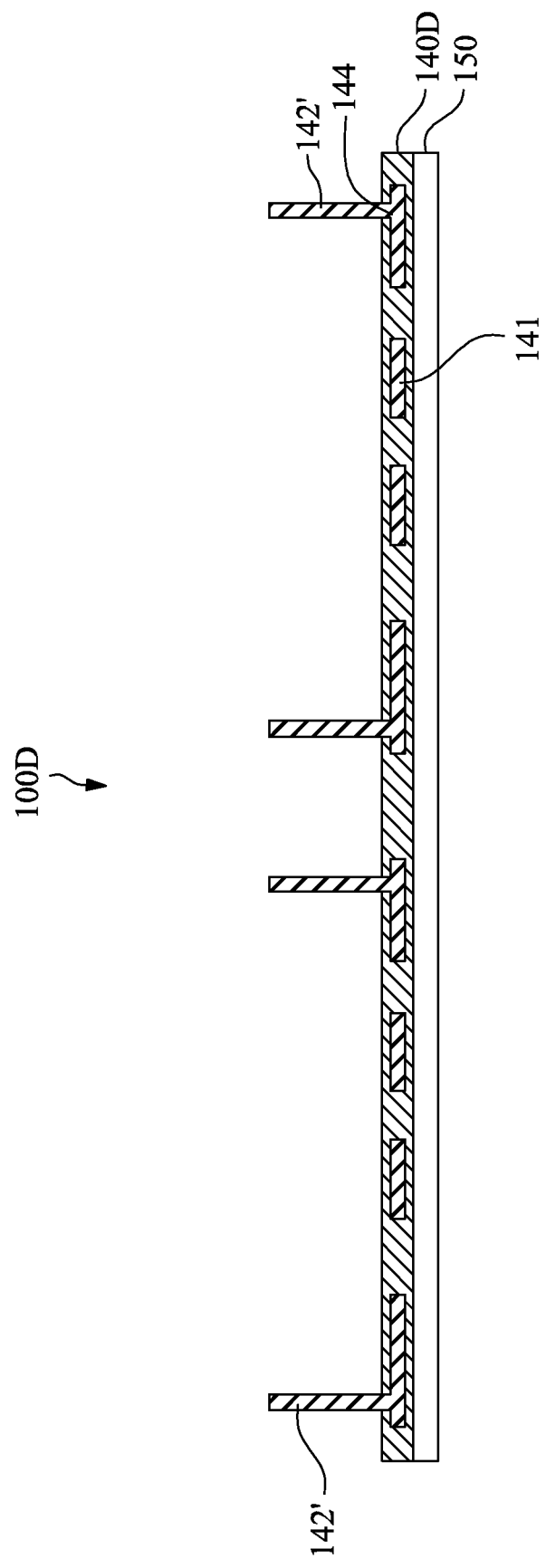

The sacrificial material 132 is then stripped or removed, as shown in FIG. 2e. After the sacrificial material 132 is removed, conductive features 142' become conductive pillars over the back-side dielectric layer 140D, as shown in FIG. 2e, in some embodiments. Conductive features 142' are electrically connected to contact pads 144 in the back-side dielectric layer 140D, in some embodiments.

In other embodiments, conductive features 142' may be formed using subtractive techniques, damascene techniques, or other methods. For example, in a subtractive technique, a conductive material such as Cu, a Cu alloy, other metals, or combinations or multiple layers thereof may be formed over the entire surface of the back-side dielectric layer 140D, and the conductive material is patterned to form the conductive features 142'. The conductive material may be patterned using photolithography, by forming a layer of photoresist over the conductive material, exposing the layer of photoresist to light or energy reflected from or transmitted through a lithography mask having a desired pattern thereon, and developing the layer of photoresist. Exposed (or unexposed, depending on whether the layer of photoresist is positive or negative) portions of the layer of photoresist are then ashed and removed. The patterned layer of photoresist is then used as an etch mask during an etch process for the conductive material. The layer of photoresist is removed, leaving the conductive material patterned with the desired pattern of conductive features 142'.

Figure 2F:
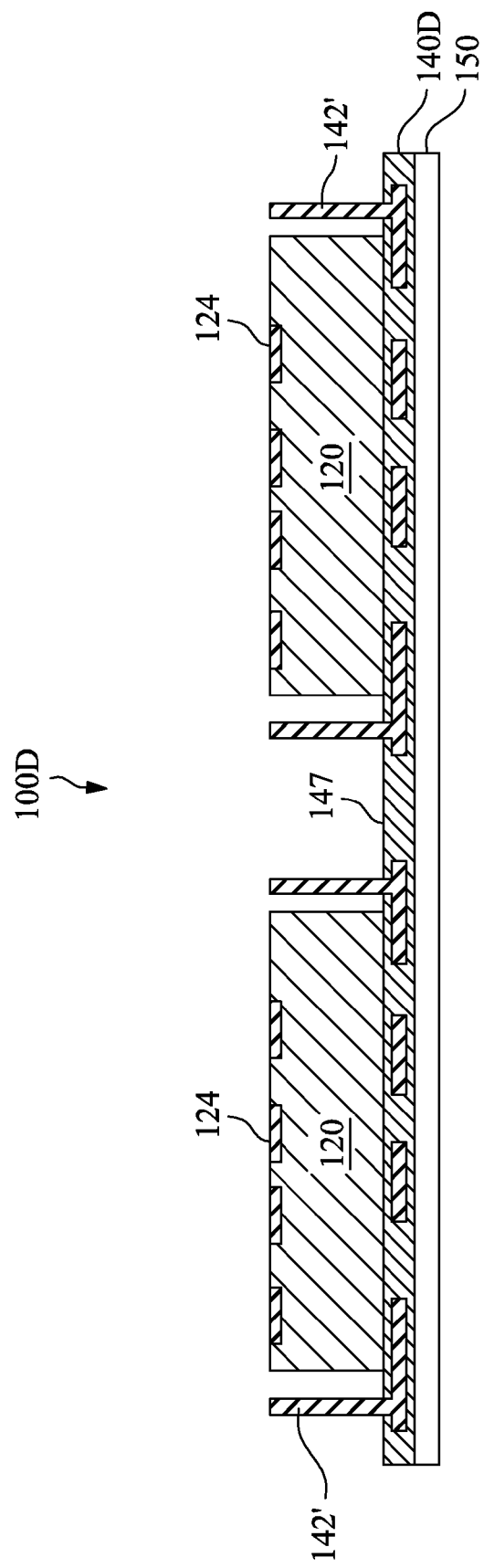

A plurality of semiconductor devices 120 are attached to an upper surface 147 of the back-side dielectric layer 140D between conductive features 142', as shown in FIG. 2f. A glue layer or die attaching film (not shown) may be used for attaching the semiconductor devices 120. Semiconductor devices 120 are attached to the back-side dielectric layers 140D with their active sides (i.e., the sides with contact pads 124) facing upward and away from the carrier, in accordance with an embodiment of the present disclosure.

Figure 2G:
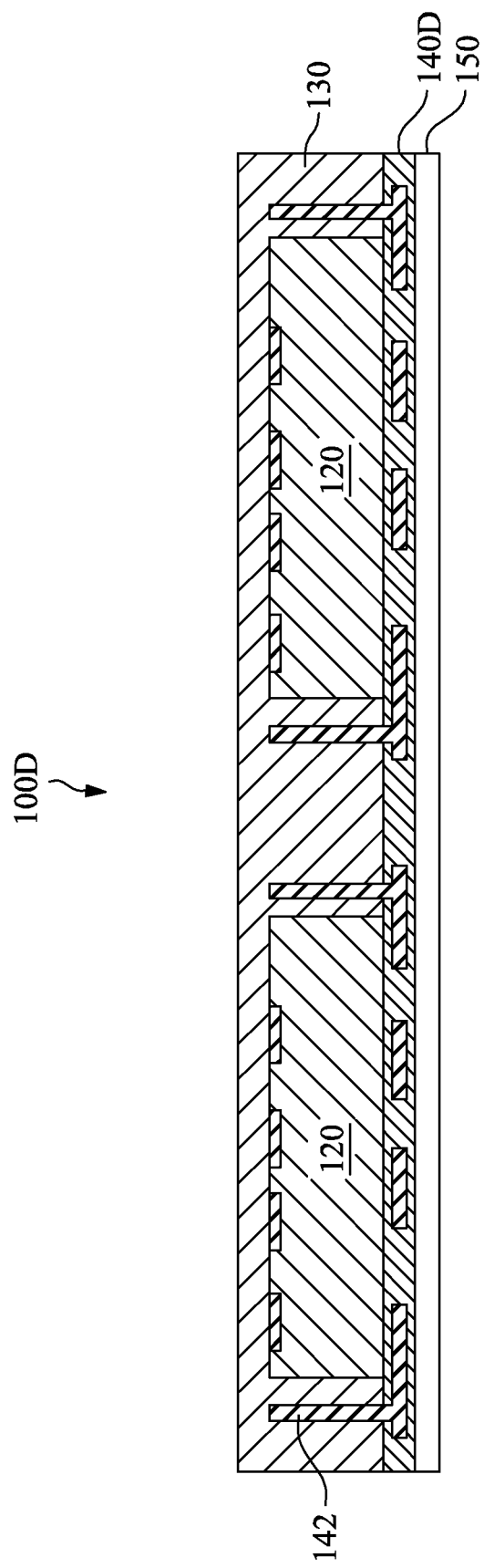

After attaching semiconductor devices 120, a lower molding layer 130 is formed over back-side dielectric layer 140D, as shown in FIG. 2g. An epoxy molding compound (EMC) may be deposited over back-side dielectric layer 140D and cured to form lower molding layer 130, in some embodiments. Lower molding layer 130 encapsulates semiconductor devices 120 and conductive features 142', and protects them from outside environment such as moisture and physical impact. Conductive features 142' become vias 142 after being encapsulated by the lower molding layer 130. In other embodiments, vias 142 may be formed after the lower molding layer 130 is formed over the back-side dielectric layer 140D. For example, vias may be formed by etching the lower molding layers to form a plurality of via holes first, then filling the via holes with conductive material to form vias.

Figure 2H:
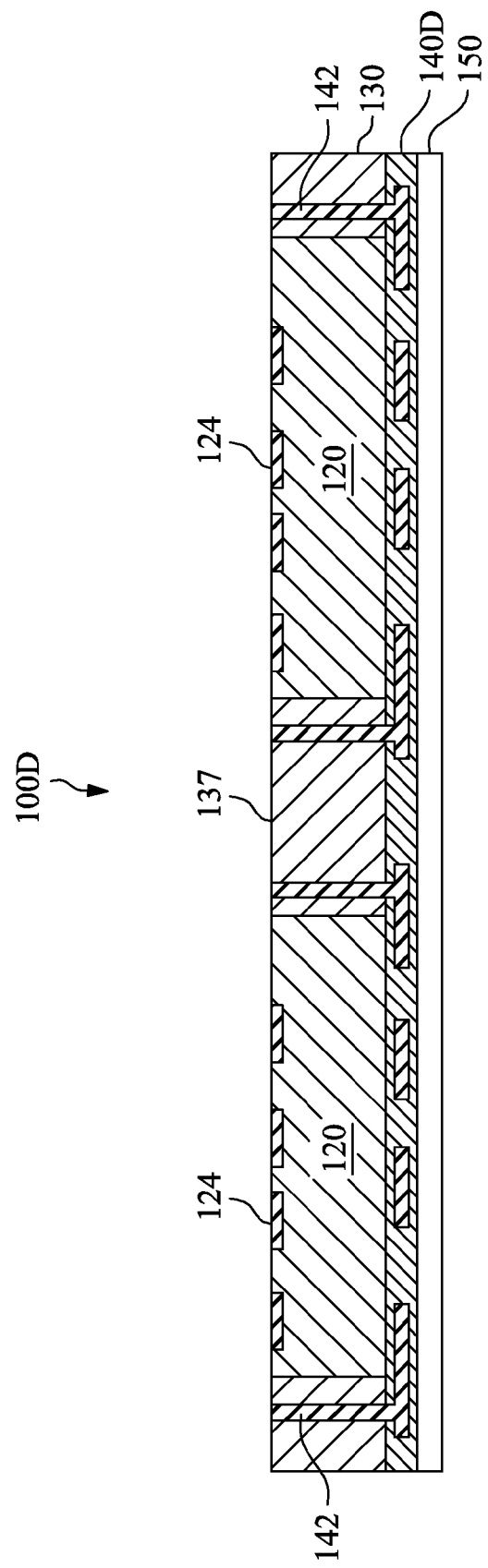

As illustrated in FIG. 2h, a planarization process may be implemented using suitable techniques such as grinding, polishing and/or chemical etching, a combination of etching and grinding techniques to generate a planar upper surface 137 for lower molding layer 130. A chemical-mechanical polishing (CMP) process may be used to produce a planar upper surface 137 for lower molding layer 130, in some embodiments.

Figure 2I:
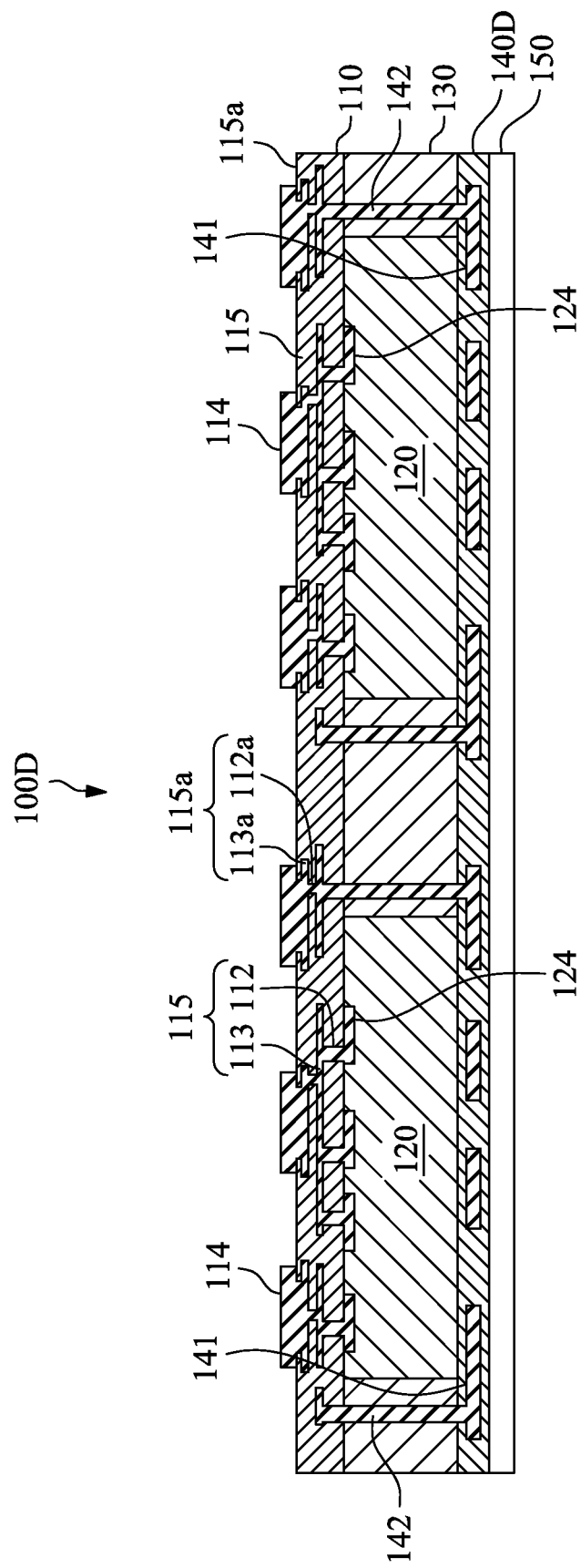

FIG. 2i shows a cross sectional view of structure 100D after a front-side dielectric layer 110 is formed on lower molding layer 130. Front-side dielectric layer 110 may comprise a plurality of dielectric layers formed using suitable methods known in the art, such as PVD, CVD, printing, spin coating, spray coating, sintering, or thermal oxidation. Front-side dielectric layers 110 may be made of polymers, such as polyimide, polybenzoxazole, or benzocyclobutene, in some embodiments, or silicon dioxide, silicon nitride, silicon oxynitride, tantalum pentoxide, or aluminum oxide, in some other embodiments.

Front-side dielectric layer 110 contains interconnect structures 115, which include one or more conductive layers of metal lines 113 and vias 112, in accordance with some embodiments. The conductive layer may be formed using patterning with PVD, CVD, sputtering, electrolytic plating, electroless plating, or other suitable metal deposition process, in accordance with some embodiments. The conductive lines and vias may comprise aluminum, copper, nickel, tin, gold, silver, or other suitable conductive materials, in some embodiments. Interconnect structures 115 connect to contact pads 124 of semiconductor devices 120, and contact pads 114 on an opposite side of front-side dielectric layer 110. In some embodiments, contact pads 114 comprise aluminum, copper, silver, gold, nickel, tungsten, alloys thereof, and/or multi-layers thereof. Interconnect structures 115a enable fan-out for bottom semiconductor package 100, since they are located outside a boundary of semiconductor devices 120 and are electrically connected to semiconductor devices 120 (not shown), hence they are called fan-out interconnect structures 115a hereafter. The redistribution contact pads 141, vias 142, and fan-out interconnect structures 115a enable fan out of the bottom package 100 and provide easy access to electrical connection for top package 200 in the PoP structure.

Figure 2J:
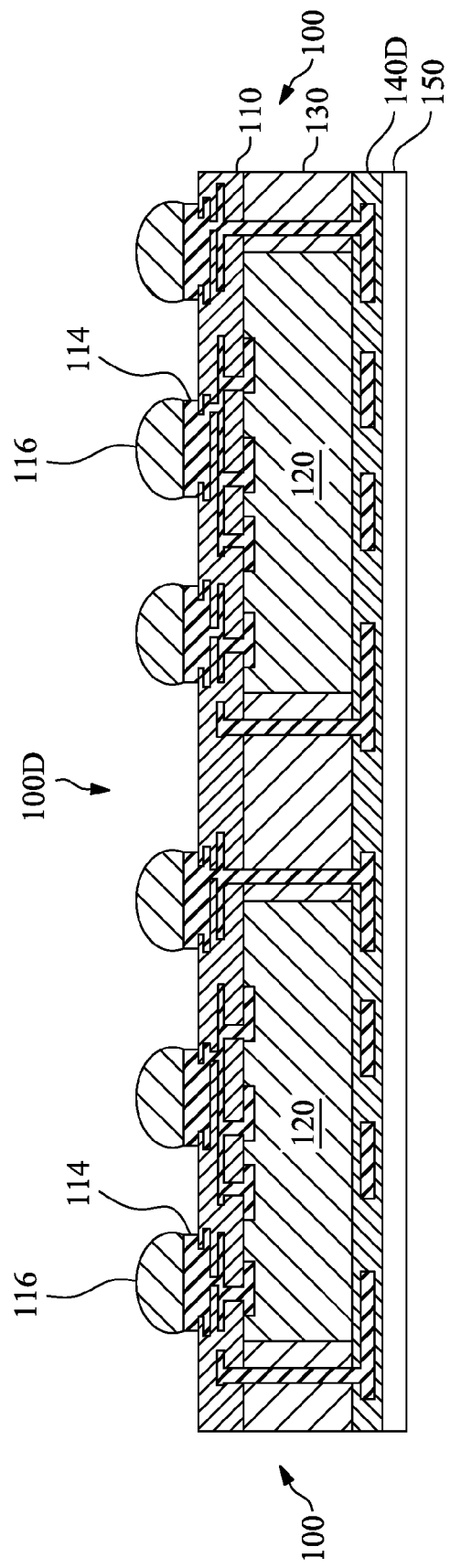

FIG. 2j shows a cross sectional view of structure 100D after external connectors 116 are bonded to contact pads 114 on the other side of front-side dielectric layer 110, in accordance with some embodiments. External connectors 116 are made of conductive materials, such as solder, solder alloy, copper, copper alloy, gold, or gold alloy, etc. External connectors 116 may be bonded to the conductive pads 114 by a reflow process. In some embodiments, external connectors 116 are BGA balls. After the step shown in FIG. 2j, structure 100D contains a plurality of bottom packages 100.

Figure 2K:
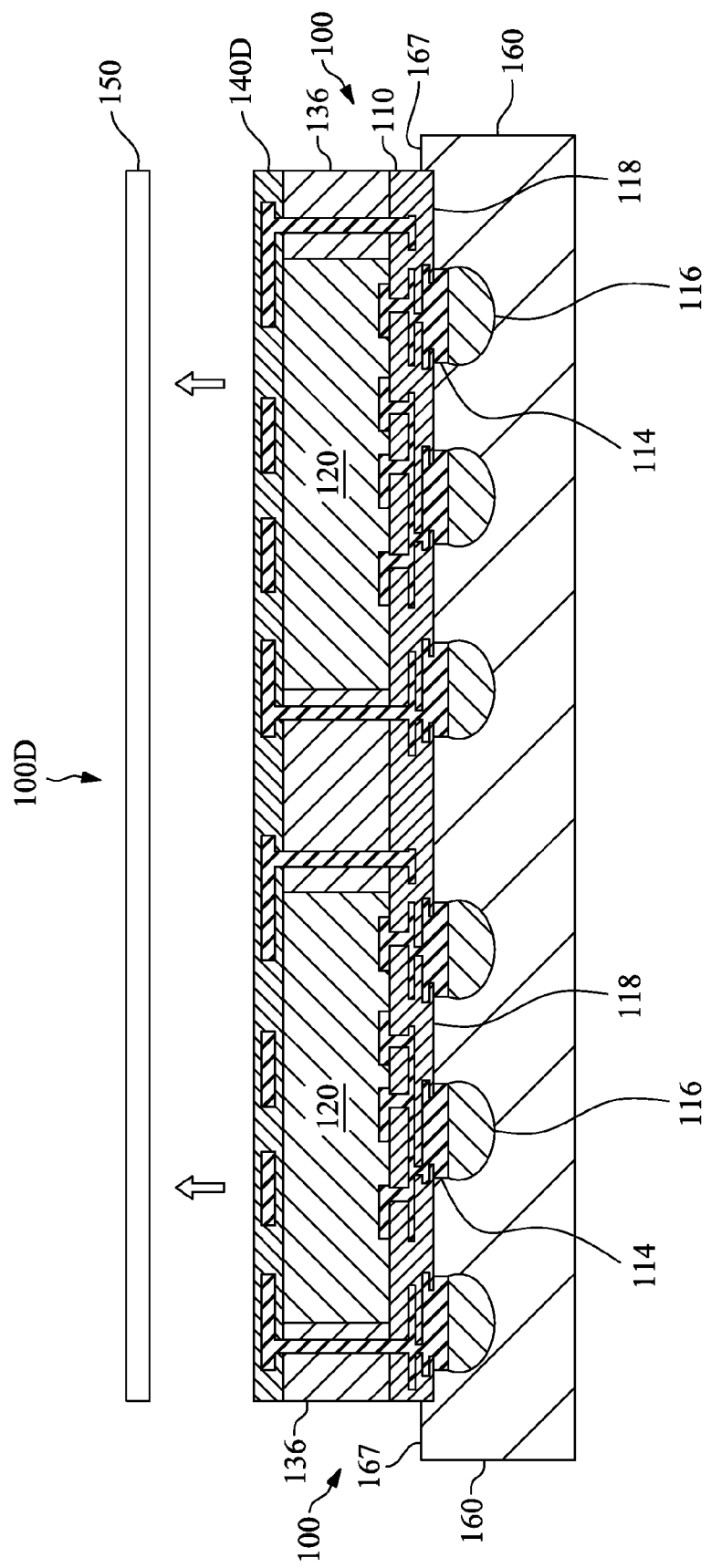
Figure 21:
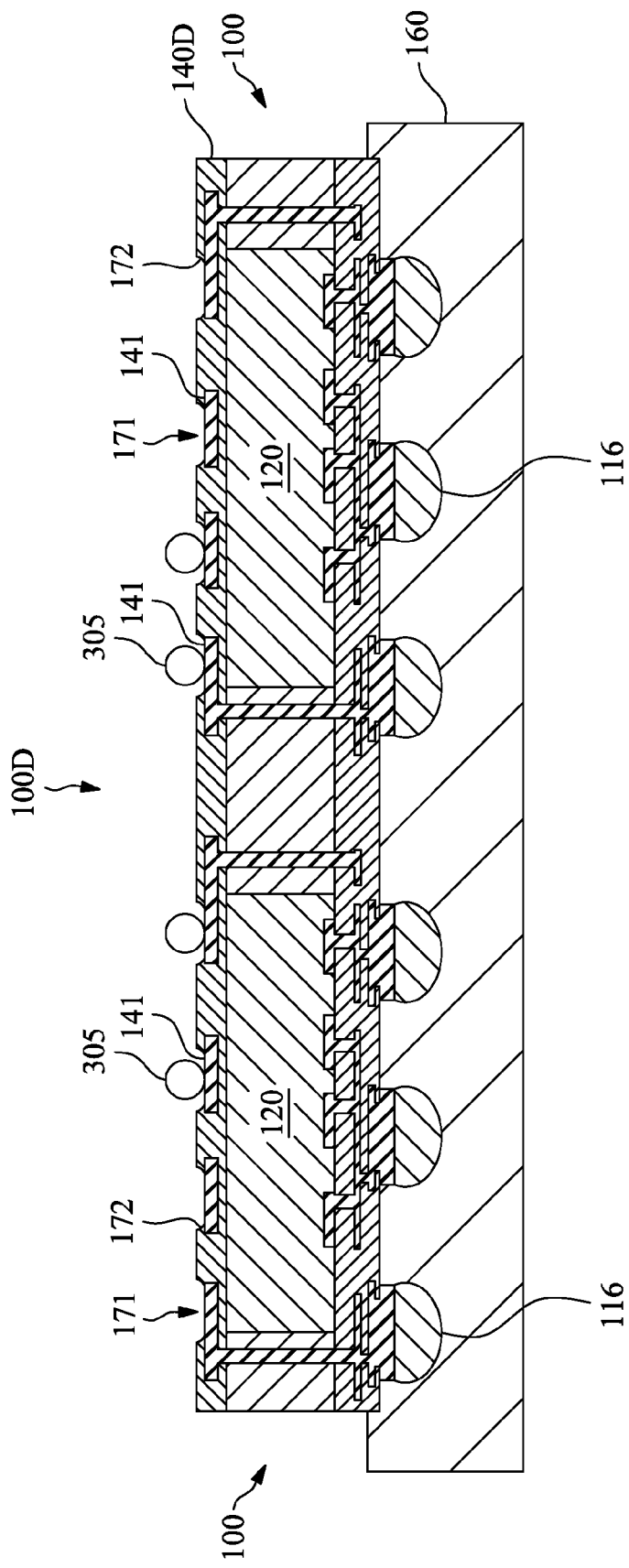

As shown in FIG. 2k in cross sectional view, the structure 100D shown in FIG. 2j is flipped over and attached to a tape 160, and carrier 150 is de-bonded. In accordance with some embodiments, tape 160 is a dicing tape, such as a dicing tape made by MINITRON Elektronik Gmbh of Germany. Tape 160 is soft and has a thickness larger than the combined height of external connectors 116 and contact pads 114 of bottom package 100, in some embodiments. In an embodiment of the present disclosure, bottom package 100 is pressed into tape 160 such that external connectors 116, contact pads 114 and a lower portion of front-side dielectric layer 110 stay below an upper surface 167 of tape 160, as shown in FIG. 2k. Tape 160 prevents lower surface 118 of bottom package 100, as well as contact pads 114 and external connectors 116, from being coated by a conductive coating during a subsequent processing step. A lower portion of a sidewall 136 of bottom package 100 may also be free of the conductive coating, since it is below the upper surface 167 of tape 160.

Carrier 150 may be de-bonded by chemical wet etching, plasma dry etching, mechanical peel-off, CMP, mechanical grinding, thermal bake, laser scanning, or wet stripping. In some embodiments, carrier 150 is a glass carrier and is de-bonded by a laser de-bonding process. Ultraviolet light emitted by an excimer laser goes through the glass and is absorbed near the glass/adhesive interface, penetrating only a few hundred nanometers and leaving the semiconductor chips in the package unaffected, in some embodiments. The ultraviolet light initiates a photochemical process that directly breaks the chemical bonds in the adhesive layer (not shown). As a result, the glass carrier can be easily separated from structure 100D.

FIG. 2l illustrates a cross sectional view of structure 100D shown in FIG. 2k after a plurality of openings 171 are formed in back-side dielectric layer 140D. Laser drilling may be used to form openings 171 in a top portion of dielectric layer 140D to expose redistribution contact pads 141, in accordance with some embodiments. The intensity of the laser may be adjusted to set a desired depth and width (e.g., diameter) of each of the openings 171. An irradiation angle of the laser may be changed such that a sidewall 172 of each of openings 171 is inclined at a desired angle. The sidewall 172 of the openings may be perpendicular or inclined, in some embodiments.

Also shown in FIG. 2l, solder paste 305 may be formed in openings 171 by a solder printing process using a solder printing machine, in accordance with some embodiments. FIG. 2l shows solder paste in some of the openings 171 for ease of illustration, it is understood that solder paste may be formed in all openings 171. In a subsequent reflow process, solder paste 305 will melt, fill up openings 171 and fuse with external connectors 216 (see FIG. 2m) of top package 200 to form inter-package connectors 320, in accordance with some embodiments.

Figure 2M:
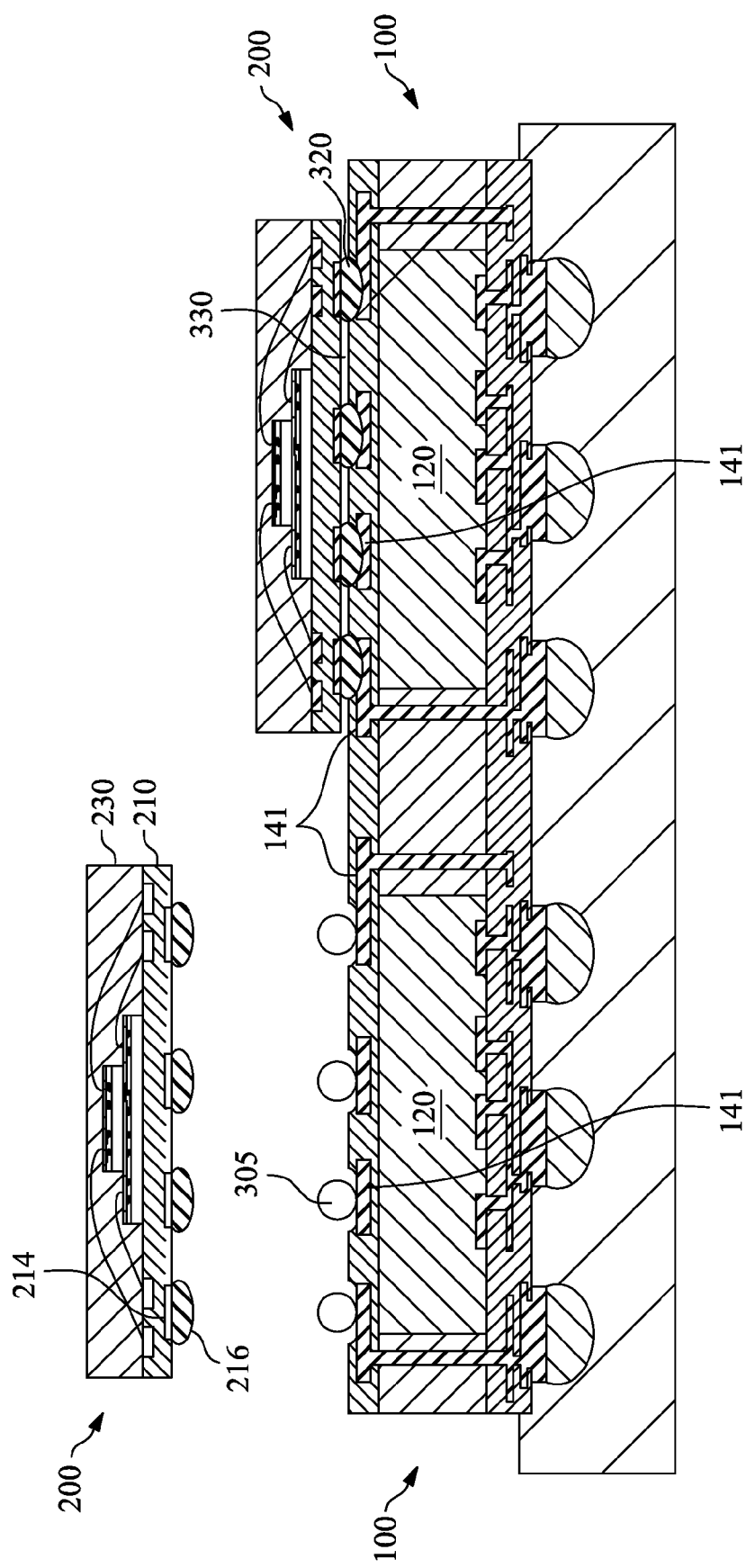

FIG. 2m shows, in cross sectional view, top packages 200 being stacked on top of bottom packages 100. Top packages 200 are aligned with bottom packages 100 so that locations of external connectors 216 of top packages match those of solder paste 305 on bottom packages. After top packages 200 are stacked on bottom packages 100, a reflow process may be performed to form inter-package connector 320, in accordance with some embodiments. Inter-package connectors 320 may be copper pillars, C4 bumps, or other suitable types of connectors, in accordance with some other embodiments. Inter-package connectors 320 connect redistribution contact pads 141 of bottom package 100 with contact pads 214 of top package 200 to form conductive paths that electrically couple the top package with the bottom package, in some embodiments. Inter-package connectors 320 may be located inside space 330, in accordance with some embodiments.

A cleaning process (not shown) may be performed to clean the residues from the reflow process, in some embodiments. A commercial solvent, such as the Micronox or Aquanox product from Kyzen Corporation may be used for cleaning. The cleaning process may include stages such as solvent cleaning, water cleaning and wind blowing performed in a commercial cleaning tool for semiconductor manufacturing, in some embodiments. The time, speed, temperature of the cleaning process may be determined by the particular PoP structure and production requirements. For example, the peak temperature of the cleaning process is less than 100° C., in some embodiments.

Figure 2N:
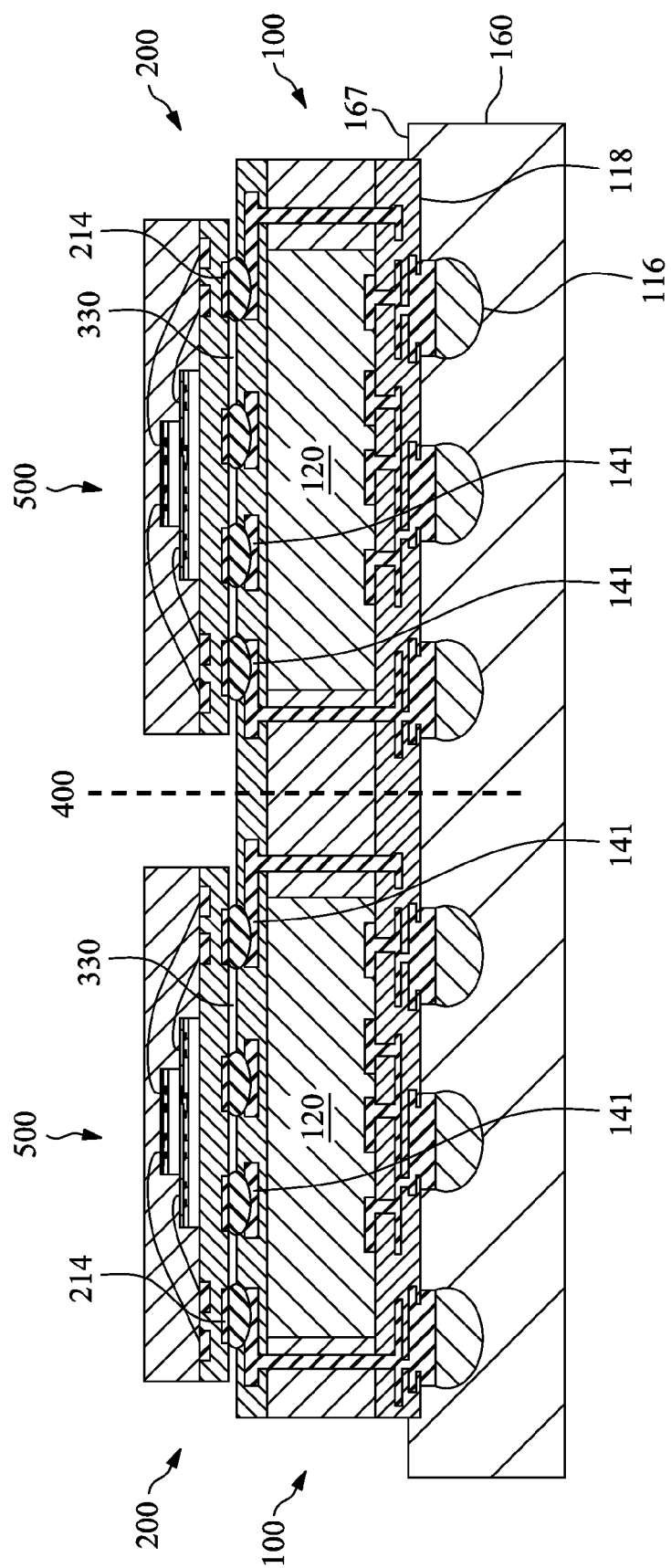

FIG. 2n shows the cross sectional view of structure 100D with a plurality of top packages attached to it. Dicing starts from the top package side and goes down to the bottom package side along a boundary 400 between two adjacent PoP packages. Dicing saw or laser, or both, may be used, in some embodiments. The depth of dicing is controlled to singulate PoP packages without cutting tape 160 into pieces, in some embodiments. After dicing, a plurality of PoP packages 500 (without conductive protection layer 410) are formed, and PoP packages 550 are still attached to tape 160 with lower surface 118 of PoP packages below the upper surface 167 of tape 160.

Figure 2O:
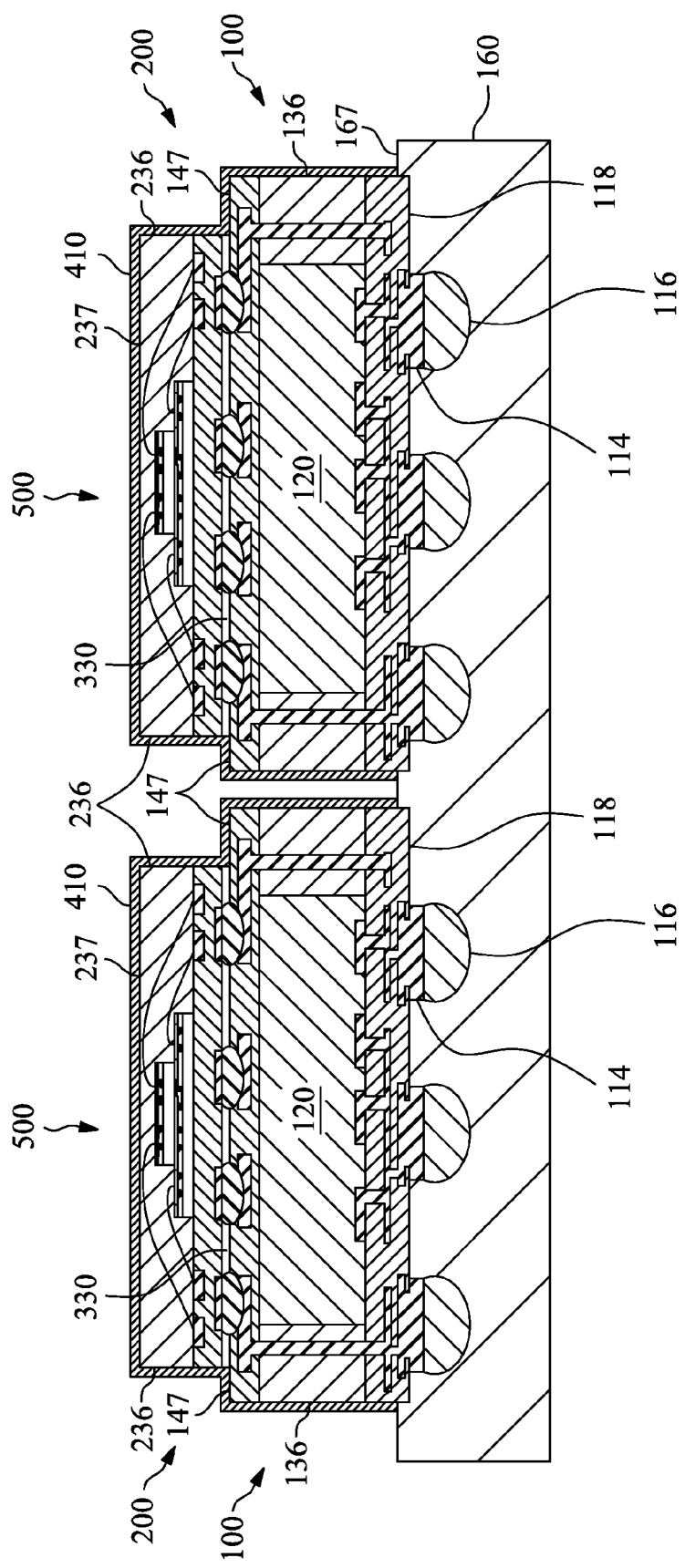

FIG. 2o shows the cross sectional view of structure 100D after a conductive protection layer 410 is formed on PoP packages 500. Conductive protection layer 410 is formed by applying a conductive coating on PoP packages 500. In some embodiments, the conductive coating may use a conductive glue such as silver glue. The conductive coating may use the Super Shield™ Nickel Conductive Coating from MG Chemicals, in some embodiments. The conductive coating may use a conductive molding material (i.e., molding material mixed with conductive material), in accordance with other embodiments. In accordance with some embodiments, the desired sheet resistivity of the conductive coating should be less than 0.5 ohms/sq at 25 µm dry coating thickness. For example, the conductive coating material could be ELECTRODAG 437 made by Henkel Corporation, which comprises substantially copper (30-60%), propyl acetate (10-30%), methacrylate polymer (5-10%), n-Butyl acetate (5-10%), isopentyl acetate (1-5%), titanium (0.1-1%), and tris (isooctadecanoato-O) (0.1-1%). In some embodiments, the ELECTRODAG 437 product is diluted by a solvent before being used. In one embodiment, the solvent is methyl ethyl ketone (butanone), i.e., MEK. For example, five parts of ELECTRODAG 437 may be mixed with four parts of MEK by volume. As another example, five parts of ELECTRODAG 437 may be mixed with 2 parts of MEK by weight.

In some embodiments, conductive coating may be applied by a spray coating process. In other embodiments, conductive coating may be spin coated on the package. For example, Hankel's ELECTRODAG 437 could be applied by spraying using conventional propeller agitated pressure pot spray systems. In an embodiment of the present disclosure, the thickness of conductive protection layer 410 has a value substantially around 40 µm. In some embodiments, the thickness of conductive protection layer 410 is in a range from about 10 µm to about 50 µm.

Conductive protection layer 410 is formed over a surface of PoP package 500 without causing electrical shorts, in some embodiments. In particular, conductive protection layer 410 seals space 330 around its perimeter, covers an upper surface 237 and a side wall 236 of top package 200, and covers portions of an upper surface 147 of bottom package 100 that extend beyond a boundary of top package 200 and a top portion of a side wall 136 of bottom package 100, in some embodiments. Due to the fact that lower surface 118 of bottom packages 100 is below an upper surface 167 of tape 160, a small lower portion of sidewall 136 near lower surface 118 of bottom package 100 may be free of conductive protection layer 410, in some embodiments. For the same reason, the lower surface 118, contact pads 114 and external connectors 116 of bottom package 100 are free of conductive protection layer 410, in some embodiments.

Conductive protection layer 410 forms a conductive shield around PoP package 500, so that static electricity accumulated on the PoP package can easily discharge through this conductive shield before reaching a hazardous high voltage level. For example, after a PoP package is manufactured, it is picked up, put in a tray and sent for final testing. Static electricity may build up during handling of the PoP package. Without proper ESD protection, a sudden ESD event might permanently damage the semiconductor chips in the PoP package. With the conductive protection layer 410, static electricity built up on the PoP package may be discharged easily to prevent high static electricity voltage level from forming. For example, static electricity on the PoP package may be discharged when the conductive protection layer 410 is in contact with a grounded test device or a human operator wearing a grounded wrist strap.

Figure 3:
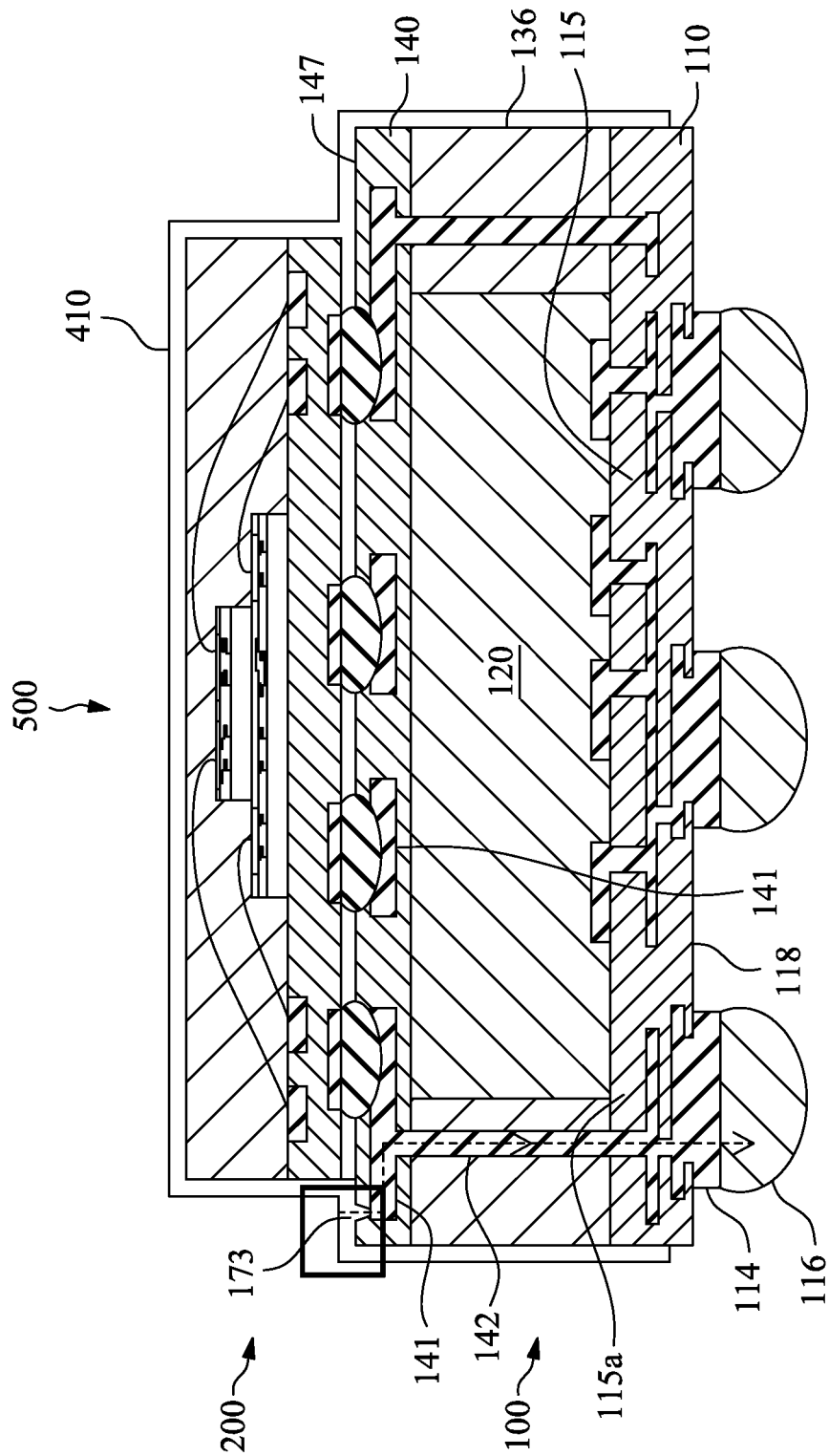
FIGS. 3 and 4 illustrate cross sectional views of a semiconductor PoP packages in accordance with other embodiments of the present disclosure.

FIG. 3 illustrates a cross sectional view of a PoP package 500 in accordance with another embodiment of the present disclosure. An opening 173 is formed on a top surface 147 of bottom package 100, in some embodiments. Opening 173 may be outside a boundary of top package 200 to facilitate filling of the opening by conductive coating, in some embodiments. The size of opening 173 is in a range substantially between 100~200 um, in accordance with some embodiments. Opening 173 exposes a conductive feature (redistribution contact pad 141, or a conductive line (not shown)) in back-side redistribution layers (BSRDLs), in accordance with some embodiments. The conductive coating fills up opening 173 and provides a conductive path (dashed line with arrow) between conductive protection layer 410 and an external connector 116 of bottom package 100. The conductive path may include the conductive fillings (i.e., conductive coating that fills opening 173), a conductive feature (a redistribution contact pad 141 or a conductive line (not shown)) in BSRDLs, via 142, a fan-out interconnect structure 115*a*, and a contact pad 114 on a lower surface 118 of front-side dielectric layer 110, in some embodiments. When the external connector 116 is in contact with ground, this provides a grounded conductive shield (i.e., conductive protection layer 410) for the PoP package which allows static electricity to discharge directly to ground before it could reach a hazardous voltage level, in accordance with some embodiments. For example, PoP packages may be stored in a grounded tray during final test and external connectors 116 may be in touch with ground all the time, in accordance with some embodiments.

In FIG. 3, opening 173 is shown on the upper surface 147 of bottom package 100 for illustration purpose. Opening 173 may be formed at other locations. For example, opening 173 might be formed in the sidewall 136 to expose a conductive feature (a redistribution contact pad 141 or a conductive line) in BSRDLs, in some embodiments. Conductive coating may fill opening 173 in the sidewall 136 to provide a conductive path between conductive protection layer 410 and an external connector 116, in some embodiments. In another embodiment, a conductive path between conductive protection layer 410 and an external connector 116 may be formed without using any opening, e.g., by forming a conductive trace between one contact pad 114 and conductive protection layer 410 along the surface of the PoP package, in accordance with some embodiments. For example, conductive glue may be used to form a conductive trace between one contact pad 114 and the conductive protection layer 410, in some other embodiments.

FIG. 3 shows that only one external connector 116 is connected to the conductive protection layer 410. It may be possible to use two or more external connectors 116 to provide better grounding for conductive protection layer 410. However, this may require that the PoP package has two or more external connectors 116 that can be connected together electrically, in some embodiments.

Figure 4:
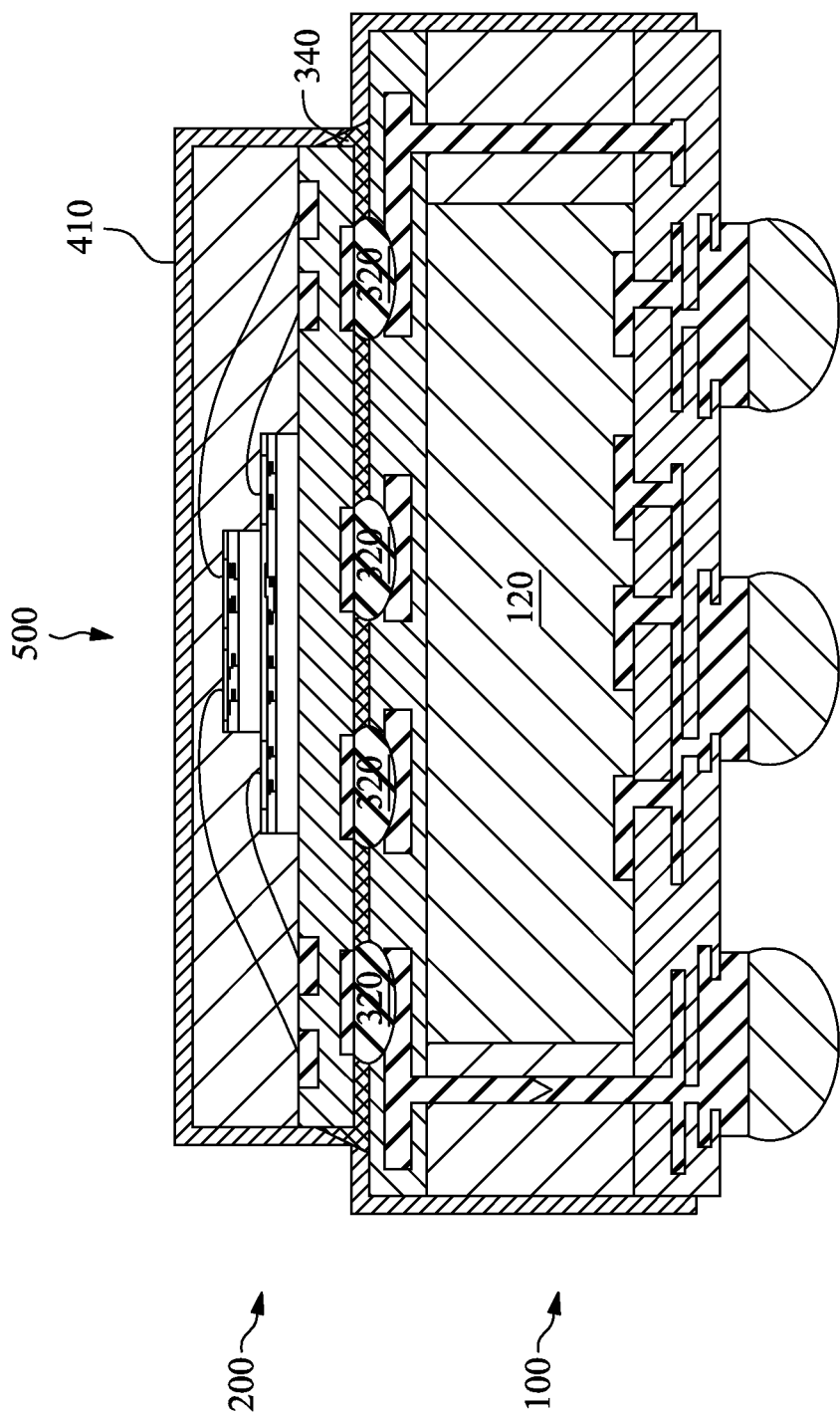
Figure 4A:
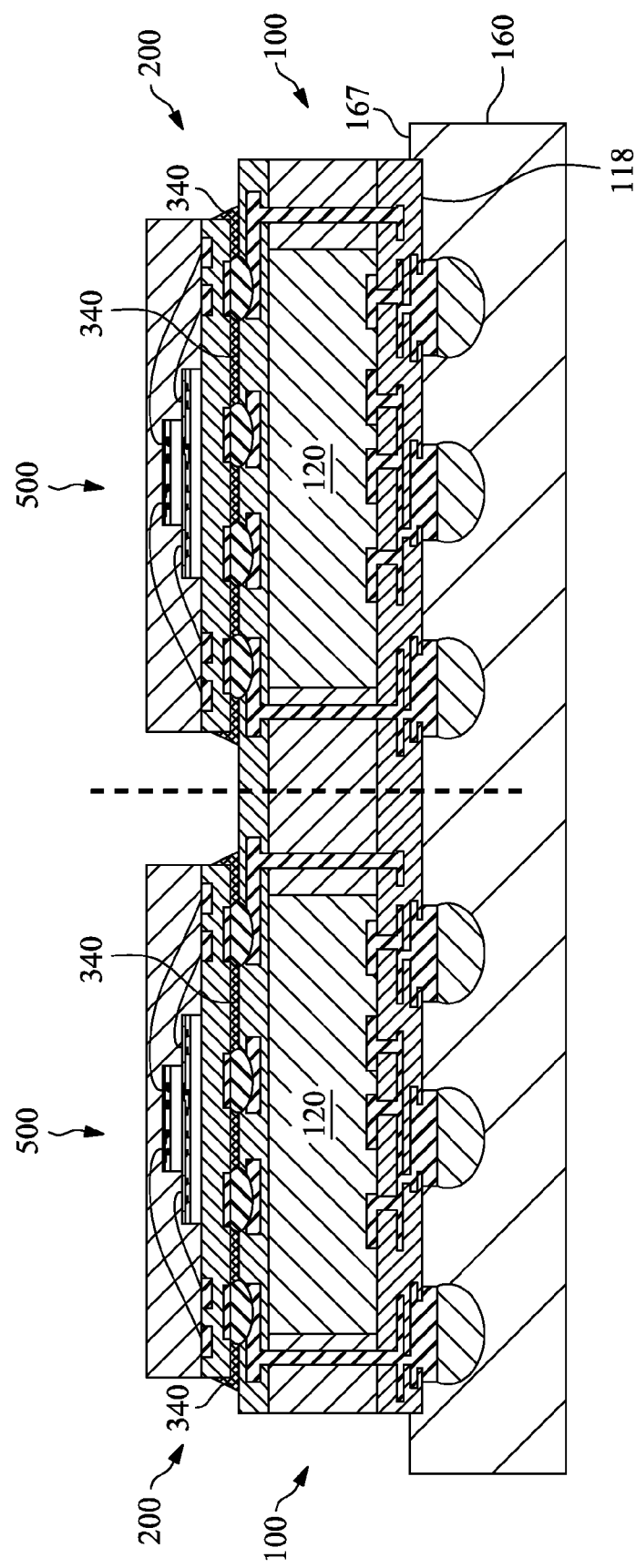
FIG. 4a-4b illustrate cross sectional views of the PoP structure shown in FIG. 4 at various manufacturing stages, in accordance with some embodiments of the present disclosure.

FIG. 4 illustrates a cross sectional view of a PoP package 500 in accordance with another embodiment of the present disclosure. An underfill material 340 fills the gap between top package 200 and bottom package 100. The PoP package shown in FIG. 4 may be manufactured following steps as shown in FIG. 2*a*-2*m*, then replacing steps shown in FIG. 2*n*-2*o* with steps shown in FIG. 4*a*-4*b*. As shown in FIG. 4*a*, an underfill material 340 fills the gap between top package 200 and bottom package 100. The underfill material 340 may be Hankel Corporation's FP4530 product, in accordance with some embodiments. Underfill material 340 may be dispensed by a capillary dispensing approach using a needle or a jetting dispenser, in some embodiments. In one embodiment, Hankel's FP4530 may be preheated to 90° C. and dispensed using a 21-gauge needle at 10 psi pressure. Underfill material 340 may completely fill the gap between top package 200 and bottom package 100, in some embodiments. In another embodiment, underfill material 340 may partially fill the gap between top package 200 and bottom package 100. Underfill material 340 may encapsulate inter-package connectors 320 individually, in some embodiments. In other embodiments, underfill material 340 may encapsulate some of the inter-package connectors 320 together and some individually, as shown in the plane view of FIG. 4*c*. Underfill material 340 may be cured under elevated temperature, in some embodiments. Underfill material 340 may provide stress relief for the inter-package connectors 320, in accordance with some embodiments.

Dicing is performed starting from the top package side down to the bottom package side. Dicing saw or laser dicing may be used, in some embodiments. The depth of dicing is controlled to singulate PoP packages without cutting tape 160 into pieces, in some embodiments. After dicing, a plurality of PoP packages 500 (without conductive protection layer 410) are formed, and PoP packages 550 are still attached to tape 160 with lower surface 118 of PoP packages below the upper surface 167 of tape 160, in accordance with some embodiments.

Figure 4B:
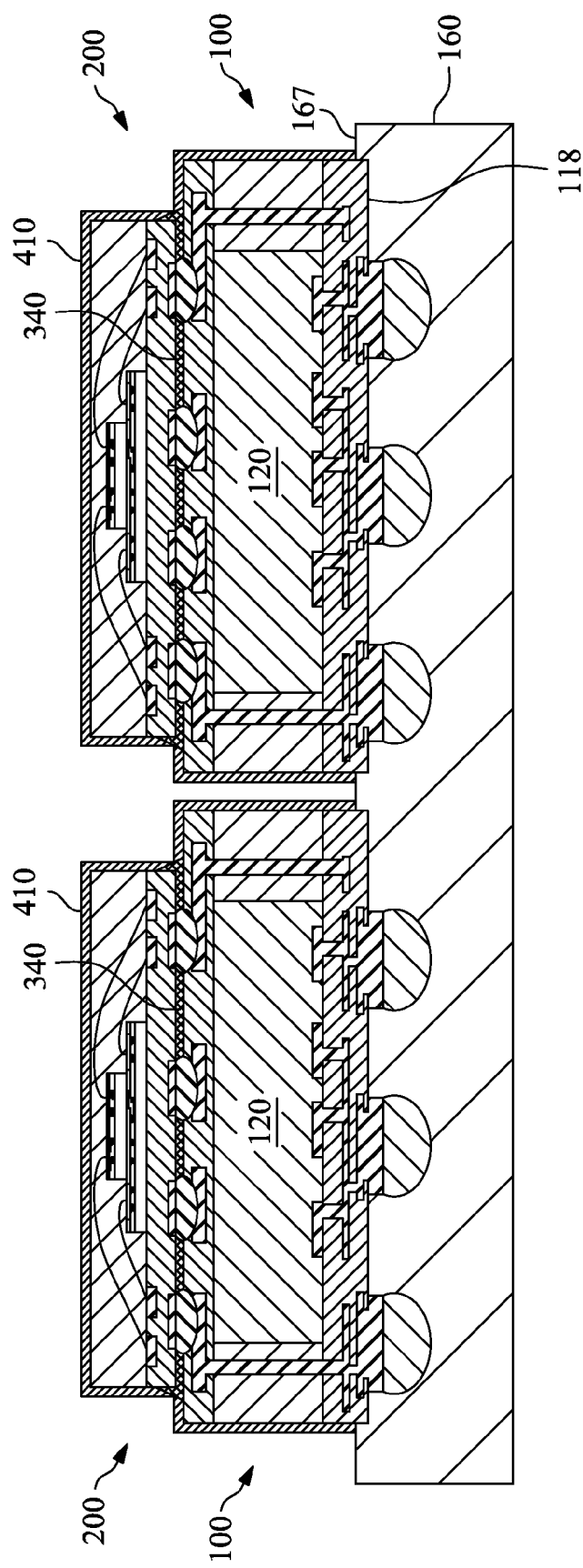
Figure 4C:
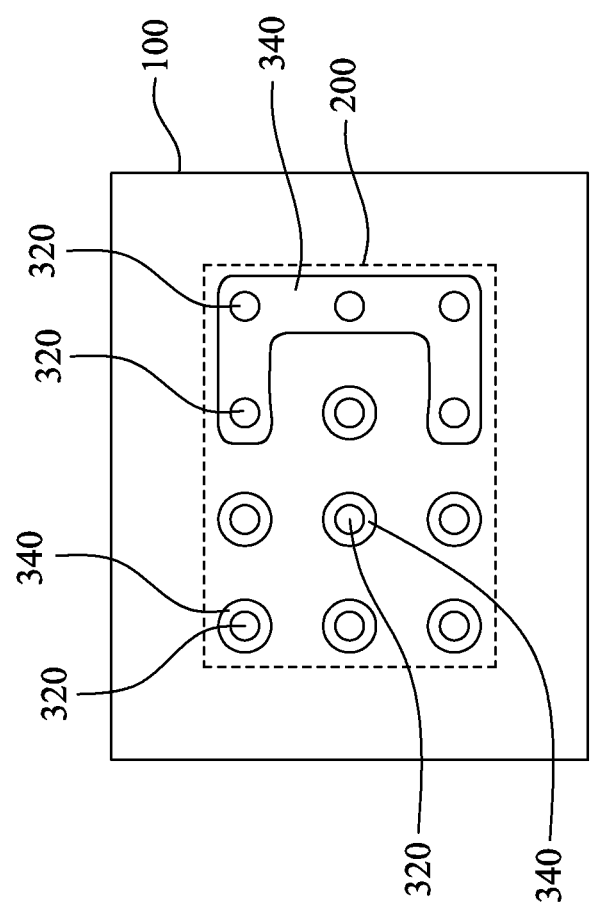
FIG. 4c illustrates a plane view of the PoP structure shown in FIG. 4 in accordance with an embodiment of the present disclosure.

FIG. 4*b* illustrates the PoP packages after conductive protection layer 410 is formed, following the same coating process as shown in FIG. 2*o*, in some embodiments.

Figure 5:
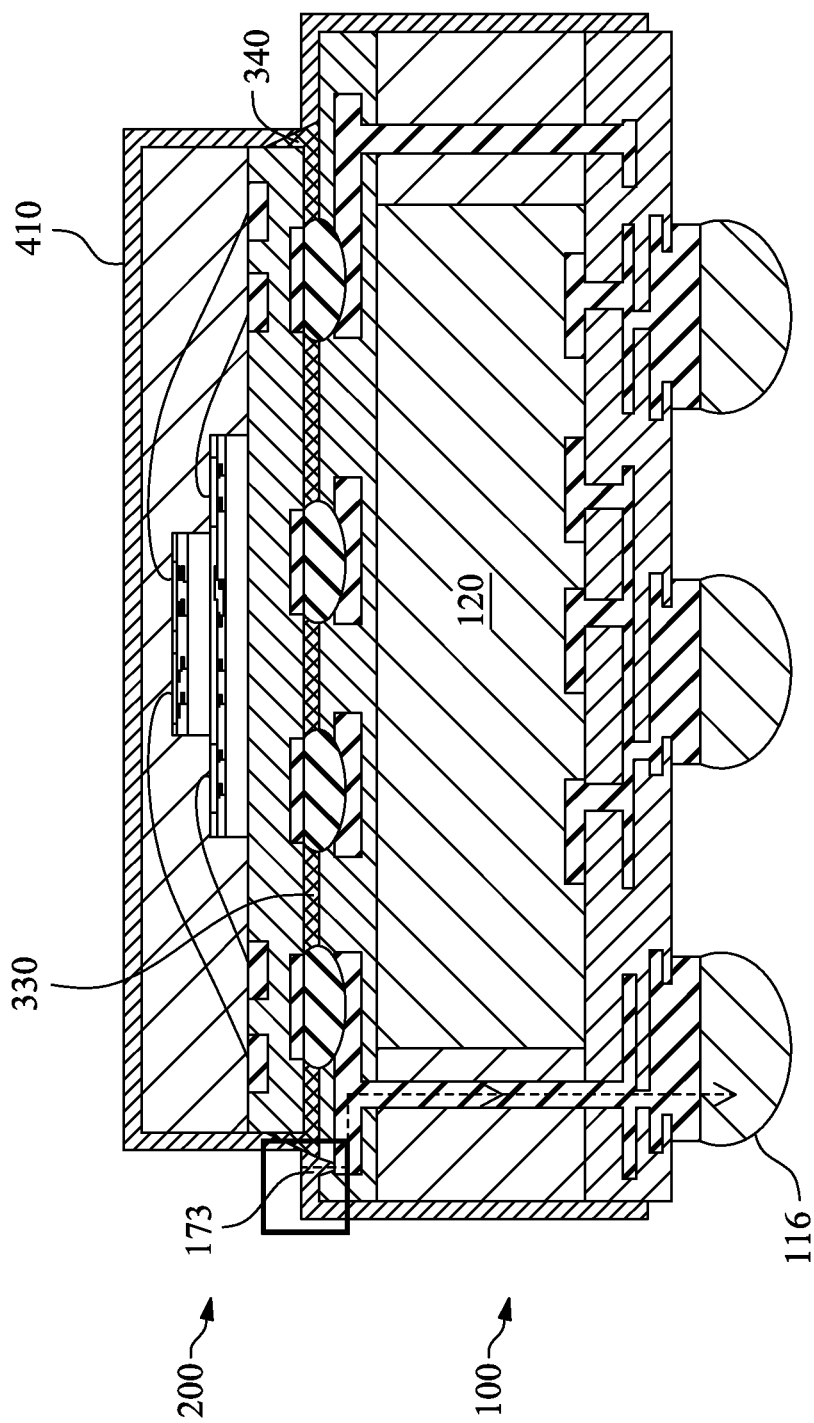
FIG. 5 illustrates a cross sectional views of a semiconductor PoP packages in accordance with an embodiment of the present disclosure.

FIG. 5 illustrates a cross sectional view of a PoP package 500 in accordance with yet another embodiment of the present disclosure. The PoP package shown in FIG. 5 combines the features shown in FIG. 3 with those shown in FIG. 4. In particular, an underfill material 340 fills space 330 between top package 200 and bottom package 100, and a conductive path (dashed line with arrow) is formed between conductive protection layer 410 and an external connector 116 of bottom package 100. Underfill 340 may provide stress relief for inter-package connectors 320, and the conductive path may provide a grounded conductive shield for the PoP package, in accordance with some embodiments.

Embodiments of the above described processes for forming a PoP package may have many advantages. By forming a conductive shield (i.e., conductive protection layer 410) over a PoP package, static electricity accumulated on the conductive shield may discharge easily, either through a grounded external connector 116 connected to conductive protection layer 410 (as shown in FIG. 3 and FIG. 5), or when conductive protection layer 410 contacts a grounded device or a human operator with proper grounding (as shown in FIG. 1 and FIG. 4). This prevents a hazardously high static electricity level from forming and damaging the semiconductor chips in the package. In addition, use of underfill material 340 relieves the mechanical stress experienced by the inter-package connectors 320, due to mismatch of coefficients of thermal expansion (CTE) in the PoP package. The use of underfill may help to prevent broken solder joints, in some embodiments.

Figure 6A:
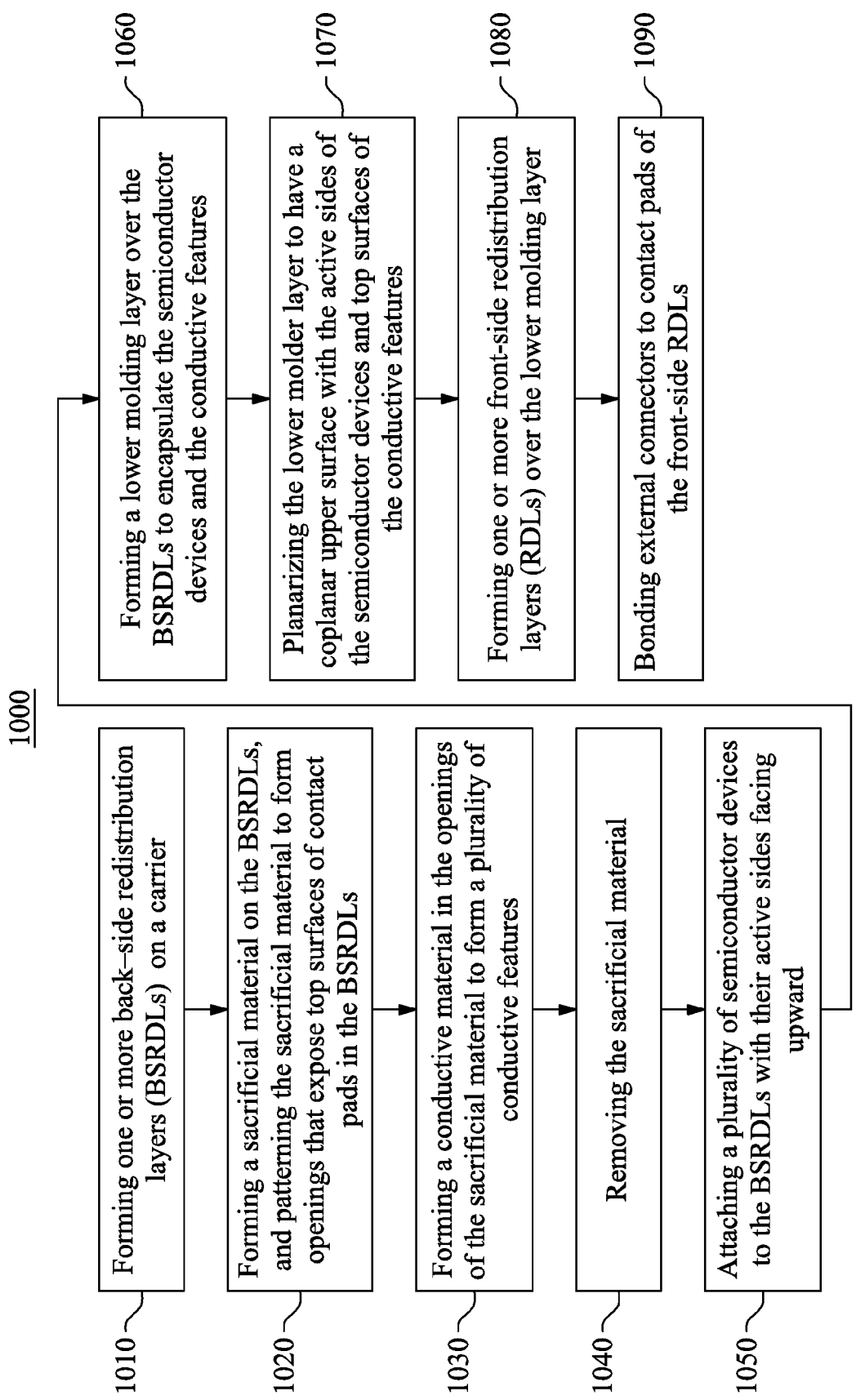
FIG. 6a illustrates a flow chart of a method for forming a structure 100D shown in FIG. 2j, in accordance with various embodiments of the present disclosure.
Figure 6B:
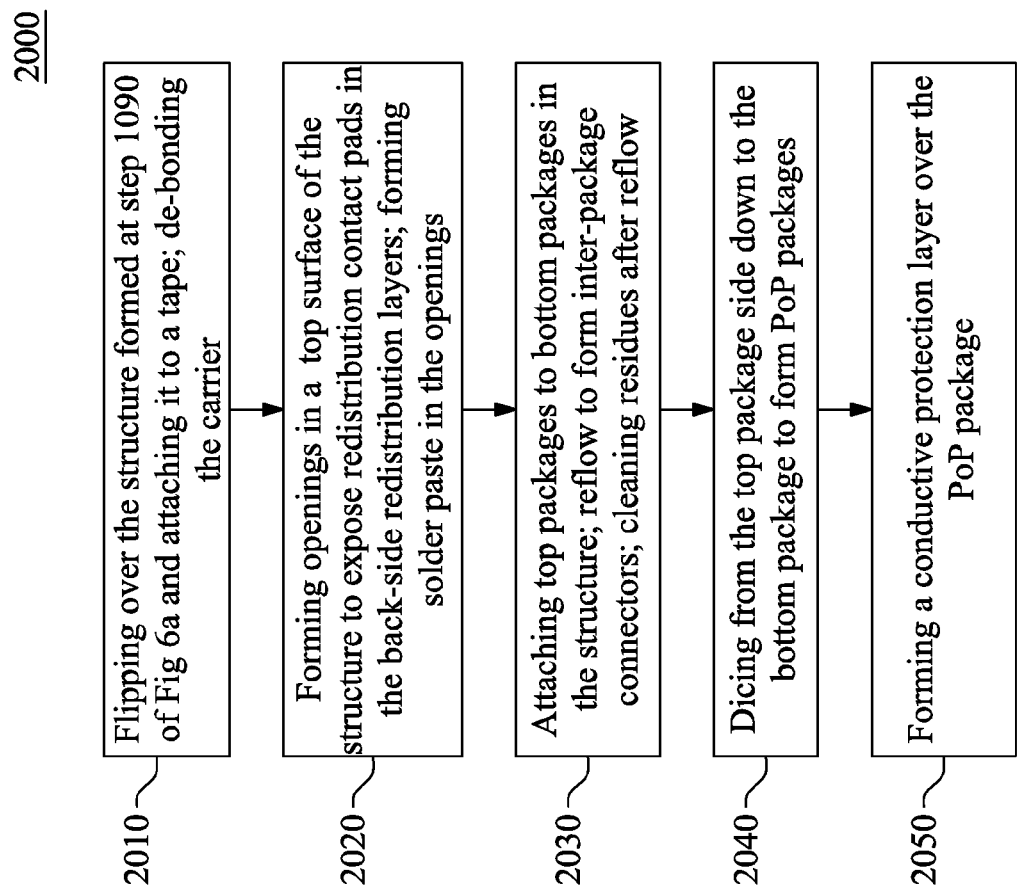
FIG. 6b illustrates a flow chart of a method for forming the PoP structure shown in FIG. 1, in accordance with various embodiments of the present disclosure.

FIG. 6*a* illustrates a flow chart of a method for forming the structure 100D shown in FIG. 2*j*, in accordance with various embodiments of the present disclosure. Structure 100D formed at the end of the processing steps in FIG. 6*a* is used at the first processing step of FIG. 6b, which illustrates a flow chart of a method for forming the PoP package shown in FIG. 1, in accordance with various embodiments of the present disclosure. The flowcharts shown in FIGS. 6a and 6b are merely an example, which should not unduly limit the scope of the claims. One of ordinary skill in the art would recognize many variations, alternatives, and modifications. For example, various steps as illustrated in FIGS. 6a and 6b may be added, removed, replaced, rearranged and repeated.

Referring to FIG. 6a. At step 1010, one or more back-side redistribution layers (BSRDLs) are formed on a carrier. At step 1020, a sacrificial material is formed on the BSRDLs then patterned to form openings that expose top surfaces of contact pads in the BSRDLs. At step 1030, a conductive material is formed in the openings of the sacrificial material to form a plurality of conductive features. At step 1040, the sacrificial material is removed. At step 1050, a plurality of semiconductor devices are attached to the BSRDLs with their active sides facing upward. At step 1060, a lower molding layer is formed over BSRDLs to encapsulate the semiconductor devices and the conductive features. At step 1070, the lower molder layer is planarized to have a coplanar upper surface with the active sides of the semiconductor devices and top surfaces of the conductive features. At step 1080, one or more front-side redistribution layers (RDLs) are formed over the lower molding layer. At step 1090, external connectors are bonded to contacts pads of the front-side RDLs.

Referring to FIG. 6b. At step 2010, the structure formed at step 1090 of FIG. 6a is flipped over and attached to a tape. The carrier is de-bonded from the structure. At step 2020, openings are formed in a top surface of the structure to expose redistribution contact pads in the BSRDLs. Solder paste is formed in the openings. At step 2030, top packages are attached to bottom packages in the structure. Reflow is performed to form inter-package connectors. Residues from the reflow process are cleaned. At step 2040, Dicing is performed starting from the top package side to the bottom package to form PoP packages. At step 2050, a conductive protection layer is formed over the PoP package.

In accordance with an embodiment, a semiconductor package comprises a top package and a bottom package with a plurality of fan-out interconnect structures. A plurality of inter-package connectors are formed inside a gap between the top package and the bottom package. A conductive protection layer is formed over the semiconductor package, wherein the conductive protection layer seals the gap around its perimeter, wherein the conductive protection layer covers an upper surface and a side wall of the top package, and wherein the conductive protection layer covers portions of an upper surface of the bottom package that extend beyond a boundary of the top package and a top portion of a side wall of the bottom package.

In accordance with an embodiment, a package-on-package (PoP) structure comprises a top package on top of a bottom package. The bottom package has a plurality of fan-out interconnect structures. A plurality of inter-package connectors are formed between the top package and the bottom package. The inter-package connectors electrically couple the top package and the bottom package. A conductive protection layer is formed over a surface of the PoP structure. The conductive protection layer avoids electrical shorts of the PoP structure.

In accordance with an embodiment, forming a PoP structure comprises attaching a top package on top of a bottom package, the bottom package having a plurality of fan-out interconnect structures; forming a plurality of inter-package connectors inside a gap between the top package and the bottom package; and applying a conductive coating over the PoP package to form a conductive protection layer, wherein the conductive protection layer seals the gap around its perimeter, covers an upper surface and a side wall of the top package, and covers portions of an upper surface of the bottom package that extend beyond a boundary of the top package and a top portion of a side wall of the bottom package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a top package comprising:
        a substrate having a first side, a first plurality of contact pads on the first side, a second side opposing the first side, and a second plurality of contact pads on the second side;
        one or more dies on the first side of the substrate and electrically coupled to the first plurality of contact pads; and
        a first molding layer on the first side of the substrate and around the one or more dies;
    a bottom package comprising:
        a first die;
        a first redistribution layer (RDL) on a first side of the first die, the first RDL having a fan-out interconnect structure;
        a second RDL on a second side of the first die opposing the first side of the first die;
        a second molding layer between the first RDL and the second RDL, wherein the second molding layer surrounds the first die; and
        a via in the second molding layer, the via being electrically coupled to the first RDL and the second RDL;
    a plurality of inter-package connectors located inside a gap between the second side of the substrate and the second RDL of the bottom package, the plurality of inter-package connectors extending from the second plurality of contact pads of the top package to corresponding redistribution contact pads in the second RDL of the bottom package; and
    an electrically conductive protection layer over exterior surfaces of the semiconductor package, wherein the electrically conductive protection layer seals the gap around its perimeter without physically contacting the inter-package connectors, wherein the electrically conductive protection layer contacts an upper surface of the first molding layer distal the substrate, sidewalls of the first molding layer, and sidewalls of the substrate, and wherein the electrically conductive protection layer contacts portions of an upper surface of the bottom package that extend beyond a boundary of the top package, and contacts sidewalls of the second RDL of the bottom package.

2. The semiconductor package of claim 1, wherein the electrically conductive protection layer comprises an electrically conductive glue or an electrically conductive molding material.

3. The semiconductor package of claim 1, further comprising an electrically conductive path between the electrically conductive protection layer and an external connector of the bottom package, wherein the external connector is attached to the first RDL of the bottom package.

4. The semiconductor package of claim 3, wherein the electrically conductive path comprises:
 an opening on a surface of the bottom package filled by the electrically conductive protection layer;
 an electrically conductive feature in the second RDL of the bottom package electrically connected to the filled opening;
 the via in the second molding layer;
 the fan-out interconnect structure in the first RDL; and
 a contact pad on a lower surface of the first RDL electrically connected to the fan-out interconnect structure.

5. The semiconductor package of claim 4, wherein the opening has a diameter in a range substantially between about 100 μm and about 200 μm.

6. The semiconductor package of claim 3, wherein the electrically conductive path is on an exterior surface of the semiconductor package.

7. The semiconductor package of claim 1, further comprising an underfill that fills the gap between the top package and the bottom package.

8. The semiconductor package of claim 1, wherein the electrically conductive protection layer contacts the sidewalls of the second molding layer.

9. A package-on-package (PoP) structure, comprising:
 a top package on top of a bottom package, wherein the top package comprises a first die attached and electrically coupled to a first side of a substrate, wherein the top package comprises a first molding layer on the first side of the substrate and around the first die, wherein the bottom package comprises a second die, a second molding layer around the second die, a first redistribution layer (RDL) over a first side of the second die, and a via in the second molding layer, the via being electrically coupled to the first RDL;
 a plurality of inter-package connectors formed between the top package and the bottom package, the inter-package connectors electrically coupling the top package and the bottom package; and
 an electrically conductive protection layer contacting exterior surfaces of the top package and exterior surfaces of the bottom package, the electrically conductive protection layer avoiding contacting inter-package connectors and external connectors of the bottom package.

10. The PoP structure of claim 9, further comprising an electrically conductive path connecting the electrically conductive protection layer with a first one of the external connectors of the bottom package.

11. The PoP structure of claim 10, wherein the electrically conductive path comprises:
 an opening in the bottom package filled by the electrically conductive protection layer;
 a second RDL on a second side of the second die opposing the first side of the second die, the second RDL being electrically coupled to the electrically conductive protection layer and the via;

the via; and
 the first RDL, wherein the first RDL is electrically coupled to the first one of the external connectors.

12. The PoP structure of claim 9, further comprising an underfill that fills a gap between the top package and the bottom package.

13. The PoP structure of claim 9, wherein the electrically conductive protection layer contacts an upper surface of the first molding layer distal the substrate, sidewalls of the first molding layer, and sidewalls of the substrate, wherein the electrically conductive protection layer further contacts sidewalls of the first RDL and sidewalls of the second molding layer.

14. A method of forming a PoP package, comprising:
 attaching a top package on top of a bottom package, wherein the top package comprises a first die on a first side of a substrate, the first die being embedded in a first molding material on the first side of the substrate, wherein the bottom package comprises a second die embedded in a second molding material, a first redistribution layer (RDL) on a first side of the second die, and a via in the second molding material, wherein the via is electrically coupled to the first RDL, and wherein the first RDL has a plurality of fan-out interconnect structures;
 forming a plurality of inter-package connectors inside a gap between the top package and the bottom package, wherein the plurality of inter-package connectors extend from contact pads on a second side of the substrate opposing the first side of the substrate to conductive features in a second RDL of the bottom package, wherein the second RDL is on a second side of the second die opposing the first side of the second die; and
 applying an electrically conductive coating over exterior surfaces of the top package and exterior surfaces of the bottom package to form an electrically conductive protection layer, wherein the electrically conductive protection layer seals the gap around its perimeter, covers an upper surface and a sidewall of the first molding material, covers portions of an upper surface of the bottom package that extend beyond a boundary of the top package, and covers opposing sidewalls of the second RDL, and wherein the electrically conductive protection layer is spaced apart from the inter-package connectors.

15. The method of claim 14, wherein the electrically conductive protection layer is an electrically conductive glue or an electrically conductive molding material with a thickness in a range from about 10 μm to 50 μm.

16. The method of claim 14, further comprising forming an electrically conductive path between the electrically conductive protection layer and an external connector of the bottom package.

17. The method of claim 16, wherein forming the electrically conductive path comprises:
 forming an opening in the bottom package to expose a first electrically conductive feature in the second RDL; and
 filling the opening with the electrically conductive coating,
 wherein the first electrically conductive feature is electrically coupled to the first RDL by the via, and wherein the first RDL is electrically coupled to the external connector.

18. The method of claim 16, wherein the electrically conductive path is formed on an exterior surface of the PoP package.

19. The method of claim 14, further comprising filling the gap between the top package and the bottom package with an underfill.

20. The method of claim 14, wherein the electrically conductive protection layer further covers sidewalls of the second molding material and at least portions of the sidewalls of the first RDL.

* * * * *